(12) United States Patent
Ahn

(10) Patent No.: US 12,418,004 B2
(45) Date of Patent: Sep. 16, 2025

(54) SEMICONDUCTOR PACKAGE AND METHOD OF FABRICATING THE SAME

(71) Applicant: Samsung Electronics Co., Ltd., Suwon-si (KR)

(72) Inventor: Seok Geun Ahn, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 642 days.

(21) Appl. No.: 17/717,559

(22) Filed: Apr. 11, 2022

(65) Prior Publication Data
US 2023/0060586 A1   Mar. 2, 2023

(30) Foreign Application Priority Data
Sep. 1, 2021 (KR) .................. 10-2021-0116251

(51) Int. Cl.
*H01L 21/48* (2006.01)
*H01L 21/56* (2006.01)
(Continued)

(52) U.S. Cl.
CPC ........ *H01L 25/105* (2013.01); *H01L 21/4857* (2013.01); *H01L 21/486* (2013.01);
(Continued)

(58) Field of Classification Search
CPC . H01L 25/105; H01L 21/4857; H01L 21/486; H01L 21/565; H01L 23/481; H01L 24/16; H01L 24/32; H01L 24/43; H01L 24/48; H01L 24/49; H01L 24/73; H01L 23/49816; H01L 23/49822; H01L 23/49838; H01L 25/0652;
(Continued)

(56) References Cited

U.S. PATENT DOCUMENTS

| 10,276,545 | B1 | 4/2019 | Huang et al. |
| 10,396,055 | B2 | 8/2019 | She et al. |

(Continued)

FOREIGN PATENT DOCUMENTS

| KR | 10-2021-0035058 A | 3/2021 |
| KR | 2021-0022321 A | 3/2021 |
| KR | 2021-0039112 A | 4/2021 |

*Primary Examiner* — Elias Ullah
(74) *Attorney, Agent, or Firm* — Harness, Dickey & Pierce, P.L.C.

(57) ABSTRACT

Disclosed are semiconductor packages and their fabrication methods. The semiconductor package comprises a package substrate, a redistribution layer on the package substrate, a vertical connection terminals that connects the package substrate to the redistribution layer, a first semiconductor chip between the package substrate and the redistribution layer, a first molding layer that fills a space between the package substrate and the redistribution layer, a second semiconductor chip on the redistribution layer, a third semiconductor chip on the second semiconductor chip, a first connection wire that directly and vertically connects the redistribution layer to a first chip pad of the third semiconductor chip, the first chip pad is beside the second semiconductor chip and on a bottom surface of the third semiconductor chip, and a second molding layer on the redistribution layer and covering the second semiconductor chip and the third semiconductor chip.

20 Claims, 28 Drawing Sheets

(51) Int. Cl.
  *H01L 23/00* (2006.01)
  *H01L 23/48* (2006.01)
  *H01L 25/10* (2006.01)
  H01L 23/498 (2006.01)
  H01L 25/065 (2023.01)

(52) U.S. Cl.
  CPC .......... *H01L 21/565* (2013.01); *H01L 23/481* (2013.01); *H01L 24/16* (2013.01); *H01L 24/32* (2013.01); *H01L 24/43* (2013.01); *H01L 24/48* (2013.01); *H01L 24/49* (2013.01); *H01L 24/73* (2013.01); *H01L 23/49816* (2013.01); *H01L 23/49822* (2013.01); *H01L 23/49838* (2013.01); *H01L 25/0652* (2013.01); *H01L 2224/16227* (2013.01); *H01L 2224/32145* (2013.01); *H01L 2224/32225* (2013.01); *H01L 2224/43847* (2013.01); *H01L 2224/48011* (2013.01); *H01L 2224/4809* (2013.01); *H01L 2224/48228* (2013.01); *H01L 2224/4903* (2013.01); *H01L 2224/49107* (2013.01); *H01L 2224/49175* (2013.01); *H01L 2224/73253* (2013.01); *H01L 2224/73265* (2013.01); *H01L 2225/0651* (2013.01); *H01L 2225/06524* (2013.01); *H01L 2225/06562* (2013.01); *H01L 2225/1023* (2013.01); *H01L 2225/1041* (2013.01); *H01L 2225/107* (2013.01)

(58) Field of Classification Search
  CPC . H01L 2224/16227; H01L 2224/32145; H01L 2224/32225; H01L 2224/43847; H01L 2224/48011; H01L 2224/4809; H01L 2224/48228; H01L 2224/4903; H01L 2224/49107; H01L 2224/49175; H01L 2224/73253; H01L 2224/73265; H01L 2225/0651; H01L 2225/06524; H01L 2225/06562; H01L 2225/1023; H01L 2225/1041; H01L 2225/107; H01L 21/56; H01L 23/3135; H01L 24/42; H01L 21/561; H01L 21/568; H01L 23/5389; H01L 25/18; H01L 25/50; H01L 23/13; H01L 23/5383; H01L 24/83; H01L 2224/04105; H01L 2224/12105; H01L 2224/214; H01L 2224/73267; H01L 2224/83191; H01L 2224/92244; H01L 2224/96; H01L 2225/06517; H01L 2225/06548; H01L 2924/00014; H01L 2924/1515; H01L 2924/18162; H01L 2924/19107

See application file for complete search history.

(56) References Cited

U.S. PATENT DOCUMENTS

| | | |
|---|---|---|
| 10,593,647 B2 | 3/2020 | Chang Chien et al. |
| 10,770,434 B2 | 9/2020 | Ding et al. |
| 2018/0026022 A1* | 1/2018 | Lee ............... H01L 23/5386 257/659 |
| 2019/0214370 A1* | 7/2019 | Ding .................. H01L 22/32 |
| 2020/0212005 A1 | 7/2020 | Fang et al. |
| 2021/0167039 A1 | 6/2021 | Zeng et al. |

* cited by examiner

SEMICONDUCTOR PACKAGE AND METHOD OF FABRICATING THE SAME

CROSS-REFERENCE TO RELATED APPLICATION

This U.S. nonprovisional application claims priority under 35 U.S.C § 119 to Korean Patent Application No. 10-2021-0116251, filed on Sep. 1, 2021, in the Korean Intellectual Property Office, the disclosure of which is hereby incorporated by reference in its entirety.

BACKGROUND

1. Field

The present inventive concepts relate to semiconductor packages and methods of fabricating the same.

2. Description of the Related Art

With the development of electronic industry, electronic products have increasing demands for higher performance, higher speed, and/or compact size. To meet the trend, there has recently been developed a packaging technology in which a plurality of semiconductor chips are mounted in a single package.

A semiconductor package is provided to implement an integrated circuit chip to qualify for use in electronic products. Typically, in the semiconductor package, a semiconductor chip is mounted on a printed circuit board (PCB) and bonding wires or bumps are used to electrically connect the semiconductor chip to the printed circuit board. With the recent development of electronic industry, the semiconductor package is variously developed to reach the goal of more compact size, smaller weight, and/or lower manufacturing cost. In addition, many kinds of semiconductor packages show up with the expansion of their application field such as higher-capacity mass storage devices.

A size of semiconductor chip becomes smaller with higher integration of the semiconductor chip. It however may be difficult to adhere, handle, and/or test solder balls due to the smaller size of the semiconductor chip. Additionally, problems of acquiring diversified mount board in accordance with the size of the semiconductor chip may occur. A fan-out package has been proposed as an approach to solve the problems.

SUMMARY

Some example embodiments of the present inventive concepts provide a compact-sized semiconductor package and a method of fabricating the same.

Some example embodiments of the present inventive concepts provide a semiconductor package with improved electrical properties and a method of fabricating the same.

Some example embodiments of the present inventive concepts provide a semiconductor package and a simplified and abbreviated method of fabricating the same.

According to some example embodiments of the present inventive concepts, a semiconductor package may comprise a package substrate, a redistribution layer on the package substrate, a vertical connection terminals that connects the package substrate to the redistribution layer, a first semiconductor chip between the package substrate and the redistribution layer, a first molding layer that fills a space between the package substrate and the redistribution layer, a second semiconductor chip on the redistribution layer, a third semiconductor chip on the second semiconductor chip, a first connection wire that directly and vertically connects the redistribution layer to a first chip pad of the third semiconductor chip, the first chip pad is beside the second semiconductor chip and on a bottom surface of the third semiconductor chip, and a second molding layer on the redistribution layer, the second molding layer covering the second semiconductor chip and the third semiconductor chip.

According to some example embodiments of the present inventive concepts, a semiconductor package may comprise a package substrate, a first semiconductor chip mounted on the package substrate, a redistribution layer on the first semiconductor chip, a plurality of first connection wires on one side of the first semiconductor chip, the first connection wires vertically connecting the package substrate to the redistribution layer, and a chip stack including a plurality of second semiconductor chips that are stacked on the redistribution layer. Each of the second semiconductor chips may have a chip pad on a bottom surface of the second semiconductor chip. The second semiconductor chips may be electrically connected to the redistribution layer through a plurality of second connection wires that vertically connect the chip pads to substrate pads of the redistribution layer.

According to some example embodiments of the present inventive concepts, a method of fabricating a semiconductor package may comprise stacking a plurality of first semiconductor chips on a dummy substrate to form a chip stack, forming a plurality of first bonding wires that connect a dummy pad of the dummy substrate to first chip pads of the first semiconductor chips, an uppermost end of each of the first bonding wires is at a level higher than a level of a top surface of the chip stack, forming on the dummy substrate a first molding layer that encapsulates the chip stack and the first bonding wires, allowing the first molding layer to undergo a thinning process that divides the first bonding wires into a plurality of second bonding wires each of which extends from one of the first chip pads and is exposed on a top surface of the first molding layer, forming on the first molding layer a redistribution layer electrically connected to the second bonding wires, placing a second semiconductor chip on the redistribution layer; forming a plurality of vertical connection terminals on one side of the second semiconductor chip and on the redistribution layer, and forming a package substrate on the redistribution layer and the second semiconductor chip, the package substrate being connected to the vertical connection terminals.

DETAILED DESCRIPTION OF EXAMPLE EMBODIMENTS

The following will now describe a semiconductor package according to the present inventive concepts with reference to the accompanying drawings.

Figure 1:
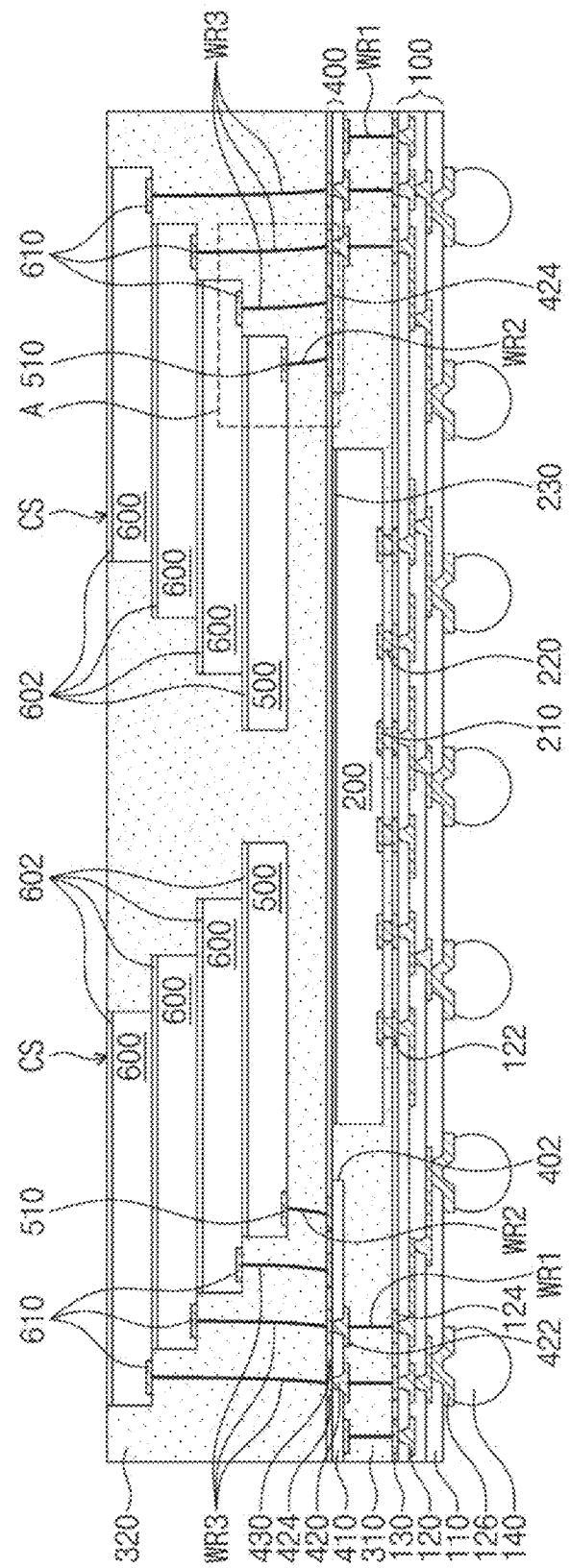
FIGS. 1 and 2 are cross-sectional views showing a semiconductor package according to some example embodiments of the present inventive concepts.
Figure 2:
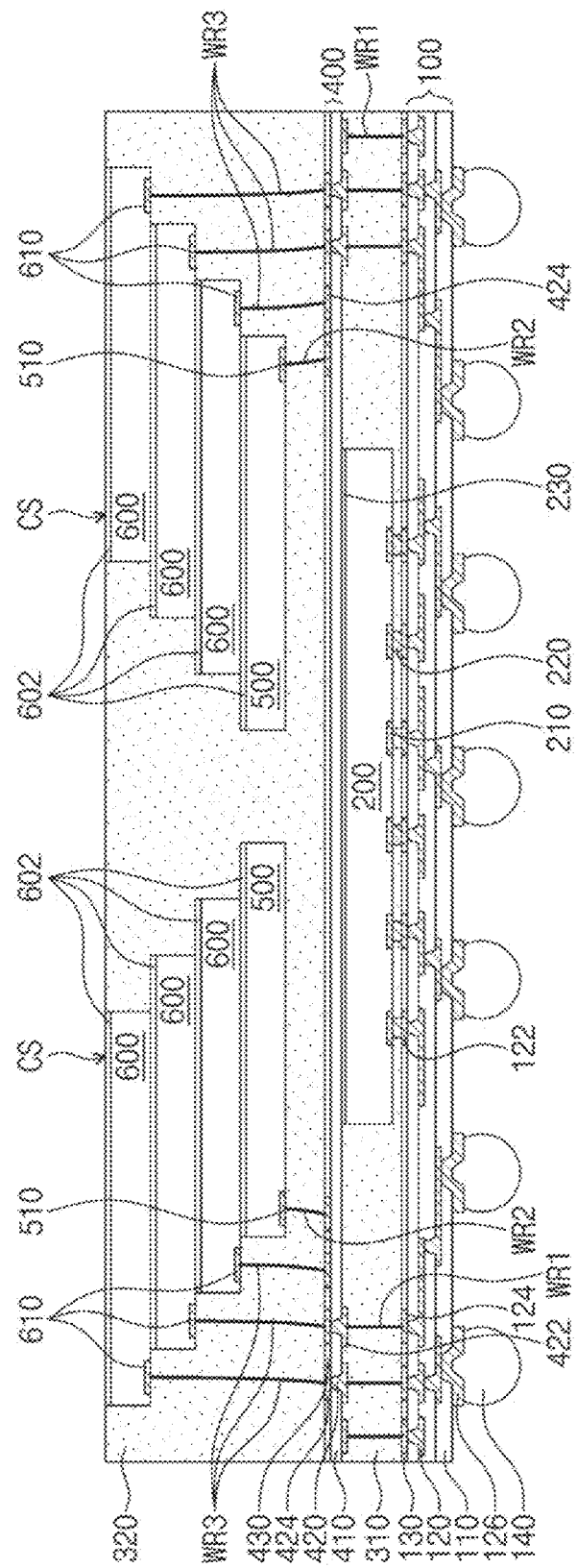
Figure 3:
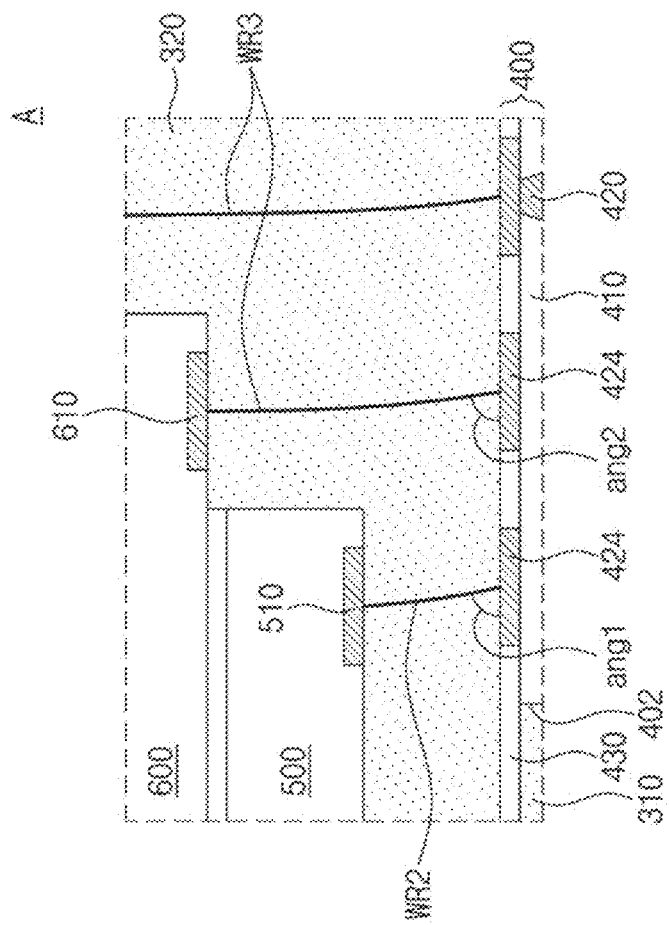
FIG. 3 is an enlarged view showing section A of FIG. 1.
Figure 4:
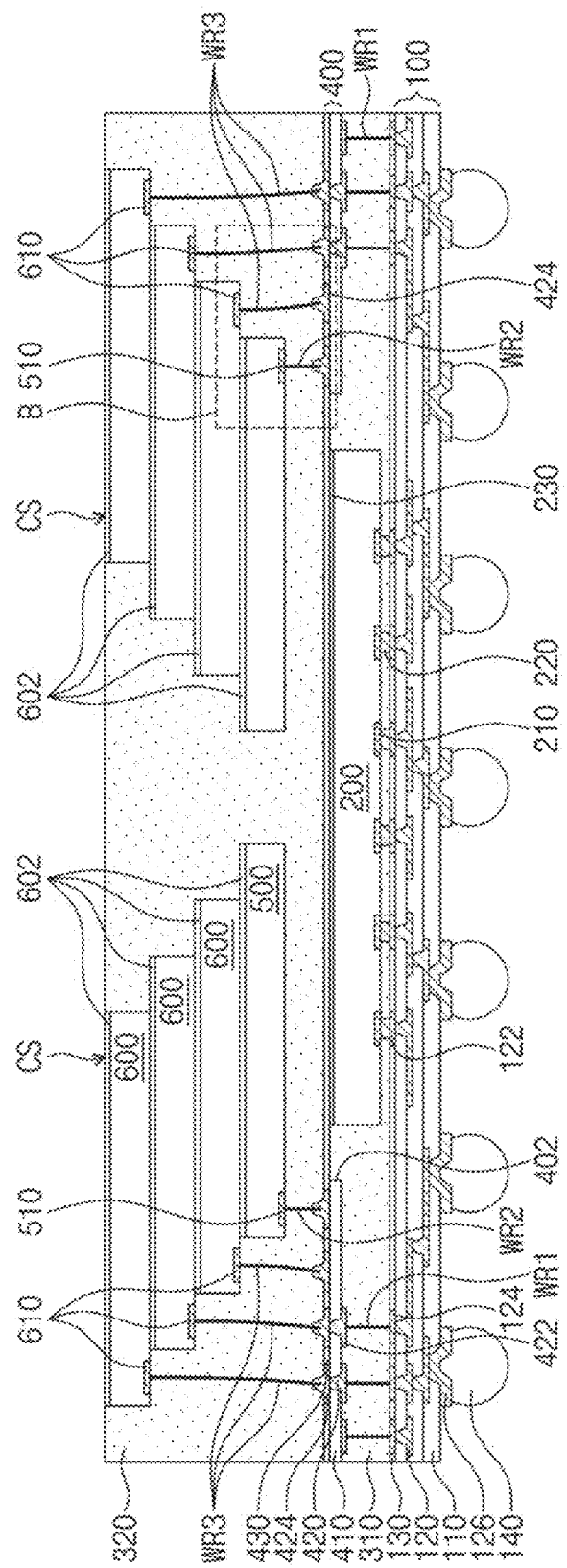
FIG. 4 is a cross-sectional view showing a semiconductor package according to some example embodiments of the present inventive concepts.
Figure 5:
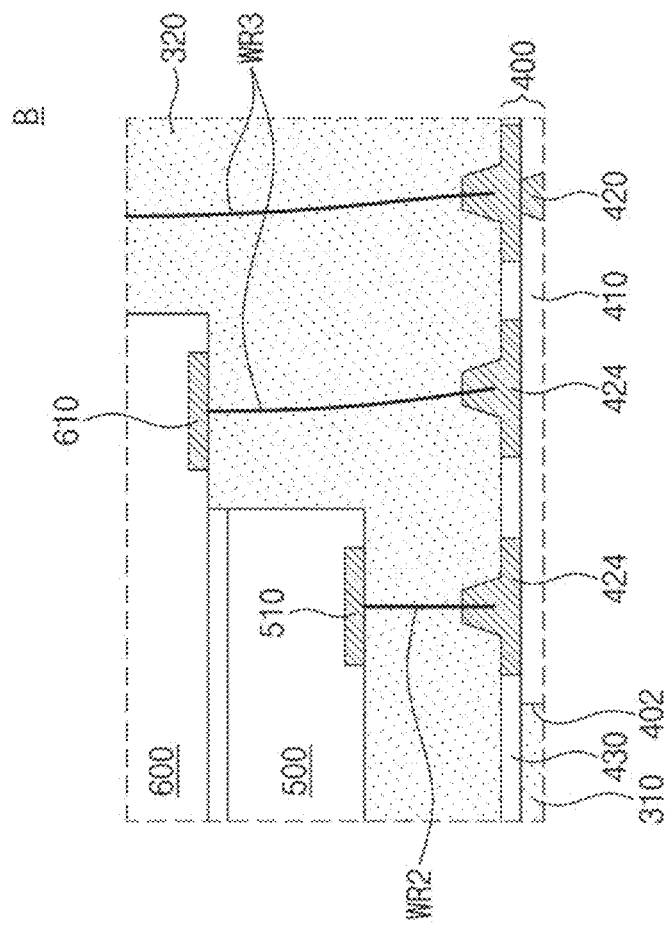
FIG. 5 is an enlarged view showing section B of FIG. 4.

FIGS. 1 and 2 are cross-sectional views showing a semiconductor package according to some example embodiments of the present inventive concepts. FIG. 3 is an enlarged view showing section A of FIG. 1. FIG. 4 is a cross-sectional view showing a semiconductor package according to some example embodiments of the present inventive concepts. FIG. 5 is an enlarged view showing section A of FIG. 4.

Referring to FIG. 1, a package substrate 100 may be provided. The package substrate 100 may be a redistribution substrate. For example, the package substrate 100 may include two or more substrate wiring layers that are stacked on each other. In this description, the term "substrate wiring layer" may indicate a wiring layer obtaining by patterning each of one dielectric material layer and one conductive material layer. For example, one substrate wiring layer may have conductive patterns that horizontally extend wiring lines without vertically overlapping each other. The substrate wiring layer may include first dielectric patterns 110 and first conductive patterns 120 in the first dielectric patterns 110. The first conductive patterns 120 in one substrate wiring layer may be electrically connected to the first conductive patterns 120 in another substrate wiring layer adjacent to the one substrate wiring layer.

The first dielectric patterns 110 may include an inorganic dielectric layer, such as a silicon oxide (SiO) layer or a silicon nitride (SiN) layer. Alternatively, the first dielectric patterns 110 may include a polymeric material. The first dielectric patterns 110 may include a dielectric polymer or a photo-imageable dielectric (PID). For example, the photo-imageable dielectric may include at least one selected from photosensitive polyimide, polybenzoxazole (PBO), phenolic polymers, and benzocyclobutene polymers.

The first conductive patterns 120 may be provided in the first dielectric patterns 110. The first conductive patterns 120 may each have a damascene structure. For example, the first conductive patterns 120 may each include a head part and a tail part that are connected into a single unitary piece. The head part may be a wire or pad portion that allows a wiring line in the package substrate 100 to expand horizontally. The tail part may be a via portion that allows a wiring line in the package substrate 100 to vertically connect with a certain component. The first conductive patterns 120 may each have an inverse T-shaped cross section. For each of the substrate wiring layers, the head part of the first conductive pattern 120 may be embedded in an upper portion of the first dielectric pattern 110, and a top surface of the head part in the first conductive pattern 120 may be exposed on a top surface of the first dielectric pattern 110. For each of the substrate wiring layers, the tail part of the first conductive pattern 120 may extend from the top surface of the head part, and may penetrate the first dielectric pattern 110 of an overlying substrate wiring layer to be coupled to the head part of another first conductive pattern 120. A top surface of the tail part in an uppermost first conductive pattern 120 may be exposed on the top surface of the first dielectric layer 110 in an uppermost one of the substrate wiring layers. The first conductive patterns 120 may include a conductive material. For example, the first conductive patterns 120 may include copper (Cu). The first conductive patterns 120 may redistribute a first semiconductor chip 200 mounted on the package substrate 100.

Substrate pads 122 and 124 may be disposed on the uppermost one of the substrate wiring layers. For example, as shown in FIG. 1, the uppermost substrate wiring layer may be configured such that the tail parts of the first conductive patterns 120 may be exposed on the top surface of the first dielectric pattern 110, and that the substrate pads 122 and 124 may be coupled to the exposed tail parts of the first conductive patterns 120. The substrate pads 122 and 124 may protrude onto the top surface of the first dielectric pattern 110. The substrate pads 122 and 124 may include first substrate pads 122 on which is mounted the first semiconductor chip 200 which will be discussed below, and may also include second substrate pads 124 to which vertical connection terminals are coupled. The first substrate pads 122 may be positioned below the first semiconductor chip 200, and the second substrate pads 124 may be positioned outside the first semiconductor chip 200.

The package substrate 100 may further include a first passivation layer 130 to protect the substrate wiring layer. The first passivation layer 130 may be disposed on an uppermost first dielectric pattern 110. On the first dielectric pattern 110, the first passivation layer 130 may surround the first and second substrate pads 122 and 124. The first passivation layer 130 may expose top surfaces of the first and second substrate pads 122 and 124. The first passivation layer 130 may have a top surface coplanar with those of the first and second substrate pads 122 and 124. The first passivation layer 130 may include an inorganic dielectric layer, such as a silicon oxide (SiO) layer or a silicon nitride (SiN) layer. Alternatively, the first passivation layer 130 may include a polymeric material. The first passivation layer 130 may include a dielectric polymer or a photo-imageable dielectric (PID). For example, the photo-imageable dielectric may include at least one selected from photosensitive polyimide, polybenzoxazole (PBO), phenolic polymers, and benzocyclobutene polymers.

FIG. 1 depicts that the tail part of the first conductive pattern 120 protrudes onto the head part of the first conductive pattern 120, but the present inventive concepts are not limited thereto. The first conductive patterns 120 may each have a T shape in which the tail part is connected to a bottom surface of the head part. For example, a top surface of the head part in the first conductive pattern 120 may be exposed on the top surface of the first dielectric pattern 110, and a bottom surface of the tail part in the first conductive pattern 120 may be exposed on a bottom surface of the first dielectric pattern 110. In some example embodiments, the tail part may be coupled to the head part of the first conductive pattern 120 in the substrate wiring layer that underlies the tail part.

Although not shown, a barrier layer may be interposed between the first dielectric pattern 110 and the first conductive pattern 120. The barrier layer may conformally cover lateral and bottom surfaces of the first conductive pattern 120. The barrier layer may include metal such as titanium (Ti) or tantalum (Ta) or metal nitride such as titanium nitride (TiN) or tantalum nitride (TaN).

A semiconductor package may have a fan-out structure by the package substrate 100. The first conductive patterns 120 may be connected to external pads 126 on a bottom surface of the package substrate 100. The external pads 126 may be pads on which external terminals 140 are disposed. The external pads 126 may penetrate a lowermost first dielectric pattern 110 to be coupled to the first conductive patterns 120.

Although not shown, a protection layer may be disposed on the bottom surface of the package substrate 100. The protection layer may cover the first dielectric patterns 110 and the first conductive patterns 120 while exposing the external pads 126. The protection layer may include a dielectric polymer such as an epoxy-based polymer, an Ajinomoto build-up film (ABF), an organic material, or an inorganic material.

The first semiconductor chip 200 may be disposed on the package substrate 100. The first semiconductor chip 200 may be disposed on a top surface of the package substrate 100. The first semiconductor chip 200 may be, for example, a logic chip or a memory chip. The first semiconductor chip 200 may be disposed in a face-down state on the package substrate 100. For example, the first semiconductor chip 200 may have a front surface directed toward the package substrate 100 and a rear surface opposite to the front surface. In this description, the language "front surface" may be defined to indicate an active surface of an integrated device in a semiconductor chip or a surface on which are formed a plurality of pads of a semiconductor chip, and the language "rear surface" may be defined to indicate an opposite surface that faces the front surface. The first semiconductor chip 200 may have first chip pads 210 provided on a bottom surface thereof. The first chip pads 210 may be electrically connected to an integrated circuit of the first semiconductor chip 200.

The first semiconductor chip 200 may be mounted on the package substrate 100. The first semiconductor chip 200 may be flip-chip mounted on the package substrate 100. For example, the front surface of the first semiconductor chip 200 may face the package substrate 100. In some example embodiments, first chip terminals 220 may be provided below the first chip pads 210 of the first semiconductor chip 200. The first chip terminals 220 may include a solder bump. The first semiconductor chip 200 may be mounted through the first chip terminals 220 on the package substrate 100. The first chip terminals 220 may connect the first chip pads 210 of the first semiconductor chip 200 to the first substrate pads 122 of the package substrate 100.

A first molding layer 310 may be provided on the package substrate 100. The first molding layer 310 may cover the top surface of the package substrate 100. When viewed in a plan view, the first molding layer 310 may surround the first semiconductor chip 200. The first molding layer 310 may cover lateral surfaces of the first semiconductor chip 200 and expose the rear surface of the first semiconductor chip 200. A top surface of the first molding layer 310 may be coplanar with the rear surface of the first semiconductor chip 200. The first molding layer 310 may fill a space between the package substrate 100 and the first semiconductor chip 200. The first molding layer 310 may surround the first chip terminals 220 between the package substrate 100 and the first semiconductor chip 200. The first molding layer 310 may include a dielectric material, such as an epoxy molding compound (EMC).

A redistribution layer 400 may be disposed on the first molding layer 310. The redistribution layer 400 may cover the first molding layer 310 and the first semiconductor chip 200. The redistribution layer 400 may be in contact with the top surface of the first molding layer 310. The redistribution layer 400 may be attached to the first semiconductor chip 200. For example, the first semiconductor chip 200 may have a first adhesion layer 230 on a top surface thereof, and the first adhesion layer 230 may attach the first semiconductor chip 200 to a bottom surface of the redistribution layer 400. The first adhesion layer 230 may include a die attach film (DAF).

The redistribution layer 400 may be a redistribution substrate. For example, the redistribution layer 400 may include one substrate wiring layer. The substrate wiring layer may include a second dielectric pattern 410 and a second conductive pattern 420 in the second dielectric pattern 410.

The second dielectric pattern 410 may be provided on the first molding layer 310. The second dielectric pattern 410 may include an inorganic dielectric layer, such as a silicon oxide (SiO) layer or a silicon nitride (SiN) layer. Alternatively, the second dielectric pattern 410 may include a polymeric material. The second dielectric pattern 410 may include a dielectric polymer or a photo-imageable dielectric (PID). For example, the photo-imageable dielectric may include at least one selected from photosensitive polyimide, polybenzoxazole (PBO), phenolic polymers, and benzocyclobutene polymers.

The second conductive pattern 420 may be provided in the second dielectric pattern 410. The second conductive pattern 420 may have a damascene structure. For example, the second conductive pattern 420 may include a head part and a tail part that are connected into a single unitary piece. The head part may be a wire or pad portion that allows a wiring line in the redistribution layer 400 to expand horizontally. The tail part may be a via portion that allows a wiring line in the redistribution layer 400 to vertically connect with a certain component. The second conductive pattern 420 may have an inverse T-shaped cross section. The head part of the second conductive pattern 420 may be provided on a bottom surface of the second dielectric pattern 410, and the tail part of the second conductive pattern 420 may extend into the second dielectric pattern 410 from a top surface of the head part. A portion of the head part of the second conductive pattern 420 may correspond to lower pads 422 of the redistribution layer 400. For example, the portion of the head part of the second conductive pattern 420 may be positioned on the bottom surface of the second dielectric pattern 410. The lower pads 422 may protrude onto the bottom surface of the second dielectric pattern 410 and may be inserted into the first molding layer 310. The lower pads 422 may be pads to which vertical connection terminals are coupled. The second conductive pattern 420 may include a conductive material. For example, the second conductive pattern 420 may include copper (Cu).

Upper pads 424 may be disposed on the second dielectric pattern 410. The upper pads 424 may be positioned on a top surface of the second dielectric pattern 410. The upper pads 424 may be electrically connected to the second conductive pattern 420. The upper pads 424 may be pads on which a chip stack CS is mounted.

The redistribution layer 400 may further include a second passivation layer 430 to protect the substrate wiring layer. The second passivation layer 430 may be disposed on the second dielectric pattern 410. On the second dielectric pattern 410, the second passivation layer 430 may surround the second conductive pattern 420. The second passivation layer 430 may expose a top surface of the second conductive pattern 420. A top surface of the second passivation layer 430 may be coplanar with that of the second conductive pattern 420. The second passivation layer 430 may include an inorganic dielectric layer, such as a silicon oxide (SiO) layer or a silicon nitride (SiN) layer. Alternatively, the second passivation layer 430 may include a polymeric material. The second passivation layer 430 may include a dielectric polymer or a photo-imageable dielectric (PID). For example, the photo-imageable dielectric may include at least one selected from photosensitive polyimide, polybenzoxazole (PBO), phenolic polymers, and benzocyclobutene polymers.

FIG. 1 depicts the redistribution layer 400 having a single substrate wiring layer, but if necessary the redistribution layer 400 may include two or more substrate wiring layers.

A portion of the first semiconductor chip 200 may be inserted into the redistribution layer 400. For example, the second dielectric pattern 410 of the redistribution layer 400 may have a chip insertion portion 402 on the bottom surface thereof. When viewed in a plan view, the chip insertion portion 402 may be positioned on a central portion of the redistribution layer 400, and the lower pads 422 may be disposed outside the chip insertion portion 402. As shown in FIG. 1, the chip insertion portion 402 may be shaped like a through hole that completely and vertically penetrates the second dielectric pattern 410 or shaped like a recess that partially penetrates a lower portion of the second dielectric pattern 410. The first semiconductor chip 200 may be inserted into the chip insertion portion 402. The first semiconductor chip 200 may be attached through the first adhesion layer 230 to a bottom surface of the chip insertion portion 402 (or a bottom surface of the second passivation layer 430 according to example embodiments of FIG. 1). The first molding layer 310 may fill an unoccupied space of the chip insertion portion 402 into which the first semiconductor chip 200 is inserted.

According to some example embodiments of the present inventive concepts, the redistribution layer 400 may have the chip insertion portion 402 obtained by removing a portion of the second dielectric pattern 410, in which portion the lower pads 422 are not provided. Therefore, there may be a reduction in overall thickness occupied by the first semiconductor chip 200 and the redistribution layer 400, and there may be provided a more compact-sized semiconductor package.

According to some example embodiments, the redistribution layer 400 may not have the chip insertion portion 402. As shown in FIG. 2, the first adhesion layer 230 may attach the first semiconductor chip 200 to the bottom surface of the second dielectric pattern 410. In some example embodiments, the top surface of the first molding layer 310 may be coplanar with the top surface of the first semiconductor chip 200 (or a top surface of the first adhesion layer 230).

The redistribution layer 400 may be electrically connected to the package substrate 100. For example, the first semiconductor chip 200 may be provided on its one side with a vertical connection terminal that connects the redistribution layer 400 to the package substrate 100. In example embodiments of FIG. 1, the vertical connection terminal may include first connection wires WR1 that directly connect the second substrate pads 124 of the package substrate 100 to the lower pads 422 of the redistribution layer 400. The first connection wires WR1 may vertically penetrate the first molding layer 310 from the top surfaces of the second substrate pads 124 to the bottom surfaces of the lower pads 422. An entirety of each of the first connection wires WR1 may be positioned between the top surface of the package substrate 100 and the bottom surface of the redistribution layer 400. An angle of about 30° to 90° may be provided between the first connection wire WR1 and the top surface of the second substrate pad 124 or between the first connection wire WR1 and the bottom surface of the lower pad 422. For example, an angle of about 90° may be provided between the first connection wire WR1 and the second substrate pad 124 or between the first connection wire WR1 and the lower pad 422.

According to some example embodiments of the present inventive concepts, the first connection wires WR1 each having a small diameter may be used as the vertical connection terminal that connects the package substrate 100 to the redistribution layer 400. The first connection wires WR1 may each have an extremely small planar area, which may result in an advantage in increasing integration of a semiconductor package.

At least one chip stack CS may be provided on the redistribution layer 400. FIG. 1 depicts two chip stacks CS, but the present inventive concepts are not limited thereto. One or three or more chip stacks CS may be provided. The following will describe in detail a configuration of one chip stack CS, and this description may be identically applied to other chip stacks CS.

The chip stack CS may have a plurality of semiconductor chips 500 and 600 that are stacked on each other. Among the semiconductor chips 500 and 600 of the chip stack CS, a lowermost semiconductor chip may be called a second semiconductor chip 500, and semiconductor chips stacked on the second semiconductor chip 500 may each be called a third semiconductor chip 600. For convenience of description in this disclosure, the second semiconductor chip 500 is defined to merely indicate a lowermost semiconductor chip included in the chip stack CS, and when the second semiconductor chip 500 or the third semiconductor chip 600 is called a different name, it may not be intended that the second semiconductor chip 500 or the third semiconductor chip 600 is a different semiconductor chip. The second semiconductor chip 500 and the third semiconductor chips 600 may include the same semiconductor chip or different semiconductor chips. For example, the second semiconductor chip 500 and the third semiconductor chips 600 may each be a memory chip, such as dynamic random-access memory (DRAM), static random-access memory (SRAM), magnetic random-access memory (MRAM), or Flash memory. Alternatively, the second semiconductor chip 500 may be a logic chip, and the third semiconductor chip 600 may be a memory chip. FIG. 1 depicts the chip stack CS having three third semiconductor chips 600, but the present inventive concepts are not limited thereto. The chip stack CS may have one, two, or four or more third semiconductor chips 600.

The second semiconductor chip 500 may be disposed in a face-down state on the redistribution layer 400. For example, the second semiconductor chip 500 may have a front surface directed toward the redistribution layer 400 and a rear surface opposite to the front surface. The second semiconductor chip 500 may have second chip pads 510 provided on a bottom surface thereof. The second chip pads 510 may be electrically connected to an integrated circuit of the second semiconductor chip 500.

The third semiconductor chips 600 may be disposed in a face-down state on the second semiconductor chip 500. For example, the third semiconductor chips 600 may each have a front surface directed toward the redistribution layer 400 and a rear surface opposite to the front surface. Each of the third semiconductor chips 600 may have third chip pads 610 provided on a bottom surface thereof. The third chip pads 610 may be electrically connected to an integrated circuit of the third semiconductor chip 600.

The second and third semiconductor chips 500 and 600 may be disposed in an offset stack structure. For example, the second and third semiconductor chips 500 and 600 may be stacked obliquely in a first direction parallel to a top surface of the redistribution layer 400, which may result in an ascending stepwise shape or a cascade shape. For example, each of the third semiconductor chips 600 may protrude in the first direction from the second semiconductor chip 500 or other third semiconductor chips 600 that are positioned thereunder.

As the second and third semiconductor chips 500 and 600 are stacked in a stepwise shape, the bottom surface (referred to hereinafter as an exposed surface) of each of the third semiconductor chips 600 may be partially exposed. In accordance with an offset stack direction of the second and third semiconductor chips 500 and 600, the exposed surfaces of the third semiconductor chips 600 may be positioned adjacent to lateral surfaces in the first direction of the third semiconductor chips 600. In this description, the expression "offset stack direction" may be defined to refer to a shift direction relative to an underlying semiconductor chip when semiconductor chips are stacked. For example, in FIG. 1, the offset stack direction of the second and third semiconductor chips 500 and 600 may be the first direction. The bottom surfaces of the second and third semiconductor chips 500 and 600 may be active surfaces. For example, the second chip pads 510 of the second semiconductor chip 500 may be disposed on the bottom surface of the second semiconductor chip 500, and the third chip pads 610 of the third semiconductor chip 600 may be provided on the exposed surface at the bottom surface of the third semiconductor chip 600. The second chip pads 510 and the third chip pads 610 may be positioned at locations that correspond to locations of the upper pads 424 included in the redistribution layer 400. For example, the second chip pads 510 and the third chip pads 610 may face the upper pads 424. The second chip pads 510 and the third chip pads 610 may be disposed vertically aligned or slightly misaligned with the upper pads 424.

The second semiconductor chip 500 and the third semiconductor chips 600 may have second adhesion layers 602 provided on top surfaces thereof. The third semiconductor chips 600 may be attached through the second adhesion layers 602 to the second semiconductor chip 500 or other third semiconductor chips 600 that are positioned thereunder. For example, the third semiconductor chips 600 may be attached through the second adhesion layers 602 to other third semiconductor chips 600 that are disposed thereunder, and a lowermost third semiconductor chip 600 may be attached through the second adhesion layer 602 to the second semiconductor chip 500. An uppermost third semiconductor chip 600 may be provided with the second adhesion layer 602 on the top surface thereof, or if necessary may not be provided with the second adhesion layer 602. The second adhesion layers 602 may include a die attach film (DAF).

When the chip stack CS is provided in plural, the offset stack directions of the chip stacks CS may be different from each other. The offset stack directions of the chip stacks CS may be changed based on an arrangement of the upper pads 424 of the redistribution layer 400 and based an arrangement of the second and third chip pads 510 and 610 of the chip stacks CS.

The chip stacks CS may be spaced apart from the redistribution layer 400. For example, the second semiconductor chip 500 may be spaced apart from the top surface of the redistribution layer 400. Therefore, the second chip pads 510 and the third chip pads 610 may be spaced apart from the redistribution layer 400.

Referring to FIGS. 1 and 3, the chip stacks CS may be mounted on the redistribution layer 400. For example, the second and third semiconductor chips 500 and 600 may be electrically connected to the redistribution layer 400. For example, connection wires WR2 and WR3 may be used to mount the second and third semiconductor chips 500 and 600 on the redistribution layer 400. For example, the connection wires WR2 and WR3 may include second connection wires WR2 that directly connect the second chip pads 510 of the second semiconductor chip 500 to the upper pads 424 of the redistribution layer 400, and may also include third connection wires WR3 that directly connect the third chip pads 610 of the third semiconductor chips 600 to the upper pads 424 of the redistribution layer 400. The second connection wires WR2 may extend from bottom surfaces of the second chip pads 510 to top surfaces of the upper pads 424, and an entirety of each of the second connection wires WR2 may be positioned between the bottom surface of the second semiconductor chip 500 and the top surface of the redistribution layer 400. The third connection wires WR3 may extend from bottom surfaces of the third chip pads 610 to the top surface of the upper pads 424, and entireties of the third connection wires WR3 may be positioned between the bottom surfaces of the third semiconductor chips 600 and the top surface of the redistribution layer 400. An angle of about 30° to about 90° may be given as a first angle ang1 between the second connection wire WR2 and the top surface of the upper pad 424 or between the second connection wire WR2 and the bottom surface of the second chip pad 510. For example, an angle of about 90° may be given as the first angle ang1 between the second connection wire WR2 and the upper pad 424 or between the second connection wire WR2 and the second chip pad 510. An angle of about 30° to about 90° may be given as a second angle ang2 between the third connection wire WR3 and the top surface of the upper pad 424 or between the third connection wire WR3 and the bottom surface of the third chip pad 610. For example, an angle of about 90° may be given as the second angle ang2 between the third connection wire WR3 and the upper pad 424 or between the third connection wire WR3 and the third chip pad 610.

According to some example embodiments of the present inventive concepts, the second and third connection wires WR2 and WR3 for mounting of the chip stacks CS may not extend from the top surfaces of the second and third semiconductor chips 500 and 600 toward the top surface of the redistribution layer 400, but may vertically extends from the bottom surfaces of the second and third semiconductor chips 500 and 600 toward the redistribution layer 400. Therefore, the second and third connection wires WR2 and WR3 may decrease in length, and a semiconductor package may increase in electrical properties. In addition, the second and third connection wires WR2 and WR3 may be used to vertically connect the second and third semiconductor chips 500 and 600 to the redistribution layer 400 while placing the second and third semiconductor chips 500 and 600 in a face-down state. The second and third connection wires WR2 and WR3 each having a small diameter may each have an extremely small planar area, which may result in an advantage in increasing integration of a semiconductor package.

FIGS. 1 and 3 depict that the second and third connection wires WR2 and WR3 are coupled to the top surfaces of the upper pads 424, but the present inventive concepts are not limited thereto. Referring to FIGS. 4 and 5, the upper pads 424 may be disposed on the second dielectric pattern 410. The upper pads 424 may be positioned on the top surface of the second dielectric pattern 410. The upper pads 424 may each have a damascene structure. For example, the upper pads 424 may each have a head part and a tail part that are connected into a single unitary piece. The upper pads 424 may each have an inverse T-shaped cross section. The head parts of the upper pads 424 may be provided in the second passivation layer 430, and the tail parts of the upper pads 424 may upwardly protrude from top surfaces of the head parts. The second passivation layer 430 may surround the head parts of the upper pads 424, but may not cover the top surfaces of the head parts of the upper pads 424 or the tail parts of the upper pads 424.

The second and third connection wires WR2 and WR3 may be coupled to the tail parts of the upper pads 424. In some example embodiments, the second and third connection wires WR2 and WR3 may be inserted into the upper pads 424. For example, portions of the second and third connection wires WR2 and WR3 may be positioned in the tail parts of the upper pads 424. Therefore, large contact areas may be provided between the upper pads 424 and the second and third connection wires WR2 and WR3, and low resistances may be provided between the upper pads 424 and the second and third connection wires WR2 and WR3. Accordingly, a semiconductor package may increase in electrical properties.

According to some example embodiments, the upper pads 424 may have their plate-like pad shapes positioned in the second passivation layer 430. For example, the upper pads 424 may not have the tail part, but may have only head parts discussed with reference to FIGS. 4 and 5. The second and third connection wires WR2 and WR3 may be inserted into the upper pads 424, and a semiconductor package may increase in electrical properties. The following description will focus on example embodiments of FIG. 1.

Referring back to FIG. 1, a second molding layer 320 may be provided on the redistribution layer 400. On the top surface of the redistribution layer 400, the second molding layer 320 may encapsulate the chip stacks CS. The second molding layer 320 may surround the chip stacks CS and expose top surfaces of the chip stacks CS. A top surface of the second molding layers 320 may be coplanar with the top surfaces of the chip stacks CS. The second molding layer 320 may fill a space between the redistribution layer 400 and the chip stacks CS. For example, the chip stacks CS may be spaced apart from the redistribution layer 400 across the second molding layer 320. The second molding layer 320 may surround the second and third connection wires WR2 and WR3 between the redistribution layer 400 and the chip stacks CS.

Figure 6:
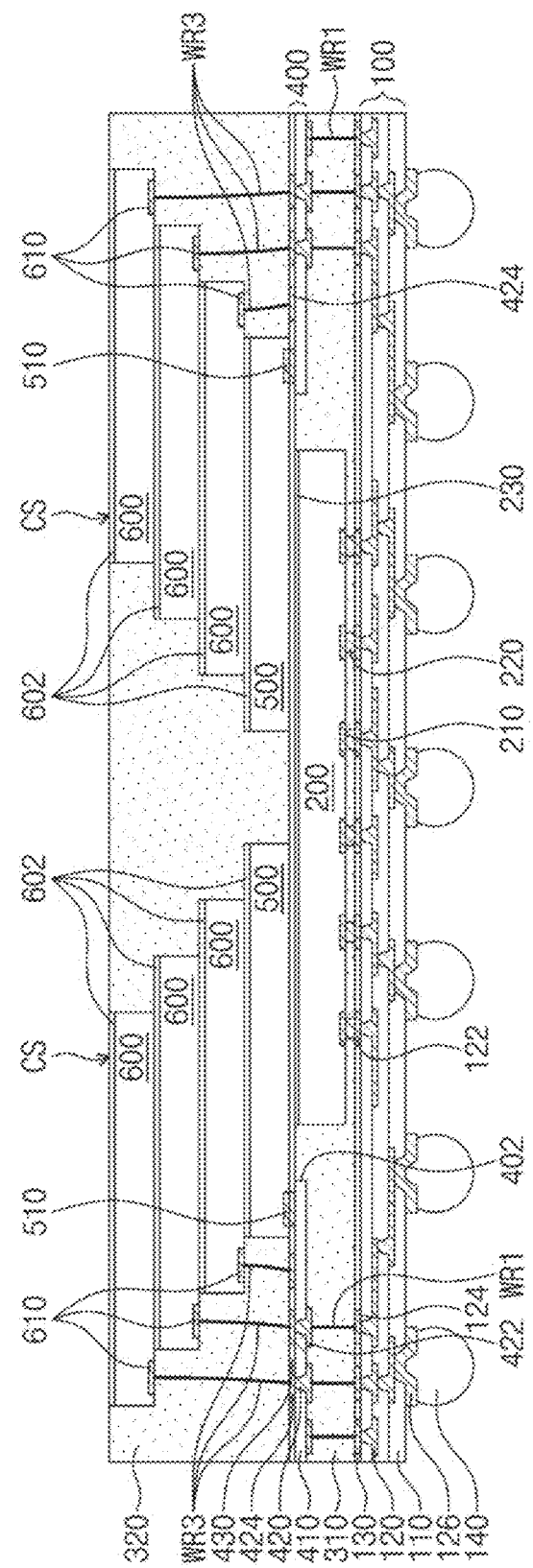
FIGS. 6 to 9 are cross-sectional views showing a semiconductor package according to some example embodiments of the present inventive concepts.

FIG. 6 is a cross-sectional view showing a semiconductor package according to some example embodiments of the present inventive concepts. In the example embodiments that follow, components the same as those discussed with reference to FIGS. 1 to 5 are allocated the same reference numerals thereto, and a repetitive explanation thereof will be omitted or abridged for convenience of description. The following description will focus on differences between example embodiments of FIGS. 1 to 5 and other example embodiments described below.

Referring to FIG. 6, the second connection wires WR2 may not be provided.

The chip stacks CS may be in contact with the redistribution layer 400. For example, the bottom surface of the second semiconductor chip 500 may be in contact with the top surface of the redistribution layer 400. The second chip pads 510 of the second semiconductor chip 500 may be in direct contact with the upper pads 424 of the redistribution layer 400. For example, the second semiconductor chip 500 and the redistribution layer 400 may be directly connected to each other without separate connection terminals. Therefore, an electrical connection length may be reduced or minimized between the second semiconductor chip 500 and the redistribution layer 400, and a semiconductor package may increase in electrical properties.

The third semiconductor chips 600 may be connected through the third connection wires WR3 to the redistribution layer 400. As the chip stacks CS are in direct contact with the redistribution layer 400, there may be a reduction in distance between the redistribution layer 400 and the third semiconductor chips 600, and an electrical connection length may be reduced or minimized between the redistribution layer 400 and the third semiconductor chips 600, with the result that a semiconductor may increase in electrical properties.

Figure 7:
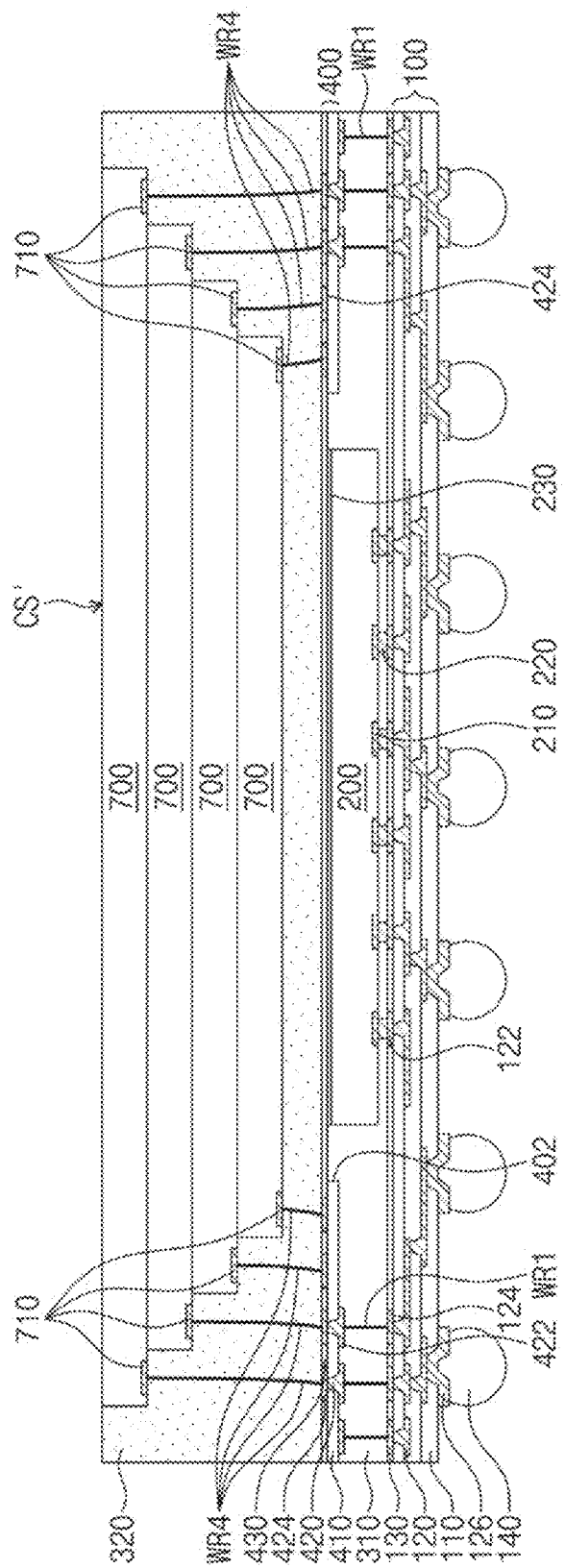

FIG. 7 is a cross-sectional view showing a semiconductor package according to some example embodiments of the present inventive concepts.

Referring to FIG. 7, a chip stack CS' may be provided on the redistribution layer 400. The chip stack CS' may have fourth semiconductor chips 700 that are vertically stacked. The fourth semiconductor chips 700 may be disposed in a face-down state. For example, the fourth semiconductor chips 700 may each have a front surface directed toward the redistribution layer 400 and a rear surface opposite to the front surface. Each of the fourth semiconductor chips 700 may have fourth chip pads 710 provided on a bottom surface thereof. The fourth chip pads 710 may be electrically connected to an integrated circuit of the fourth semiconductor chip 700.

The fourth semiconductor chips 700 may have their widths that increase with increasing distance from the redistribution layer 400. Each of the fourth semiconductor chips 700 may expose opposite ends of another fourth semiconductor chip 700 positioned thereabove. For example, the fourth semiconductor chips 700 may be stacked in an inverse pyramid shape. Alternatively, each of the fourth semiconductor chips 700 may expose only one end of another fourth semiconductor chip 700 positioned thereabove, and other end of the fourth semiconductor chips 700 may be aligned with each other. The fourth semiconductor chips 700 may be attached to each other through third adhesion layers 702 provided on top surfaces thereof. Therefore, the bottom surface of each of the fourth semiconductor chips 700 may be partially exposed. In addition, each of the fourth semiconductor chips 700 may expose the fourth chip pads 710 of another fourth semiconductor chip 700 disposed thereabove. The fourth chip pads 710 may be positioned at locations that correspond to locations of the upper pads 424 included in the redistribution layer 400. For example, the fourth chip pads 710 may face the upper pads 424. The fourth chip pads 710 may be disposed vertically aligned or slightly misaligned with the upper pads 424.

The chip stack CS' may be mounted on the redistribution layer 400. For example, the fourth semiconductor chips 700 may be electrically connected to the redistribution layer 400. For example, the fourth semiconductor chips 700 may be mounted through fourth connection wires WR4 on the redistribution layer 400. For example, the fourth connection wires WR4 may directly connect the fourth chip pads 710 of the fourth semiconductor chips 700 to the upper pads 424 of the redistribution layer 400. The fourth connection wires WR4 may extend from bottom surfaces of the fourth chip pads 710 to the top surfaces of the upper pads 424, and an entirety of each of the fourth connection wires WR4 may be positioned between the bottom surface of the fourth semiconductor chip 700 and the top surface of the redistribution layer 400. An angle of about 30° to about 90° may be provided between the fourth connection wire WR4 and the top surface of the upper pad 424 or between the fourth connection wire WR4 and the bottom surface of the fourth chip pad 710. For example, an angle of about 90° may be provided between the fourth connection wire WR4 and the upper pad 424 or between the fourth connection wire WR4 and the fourth chip pad 710.

Figure 8:
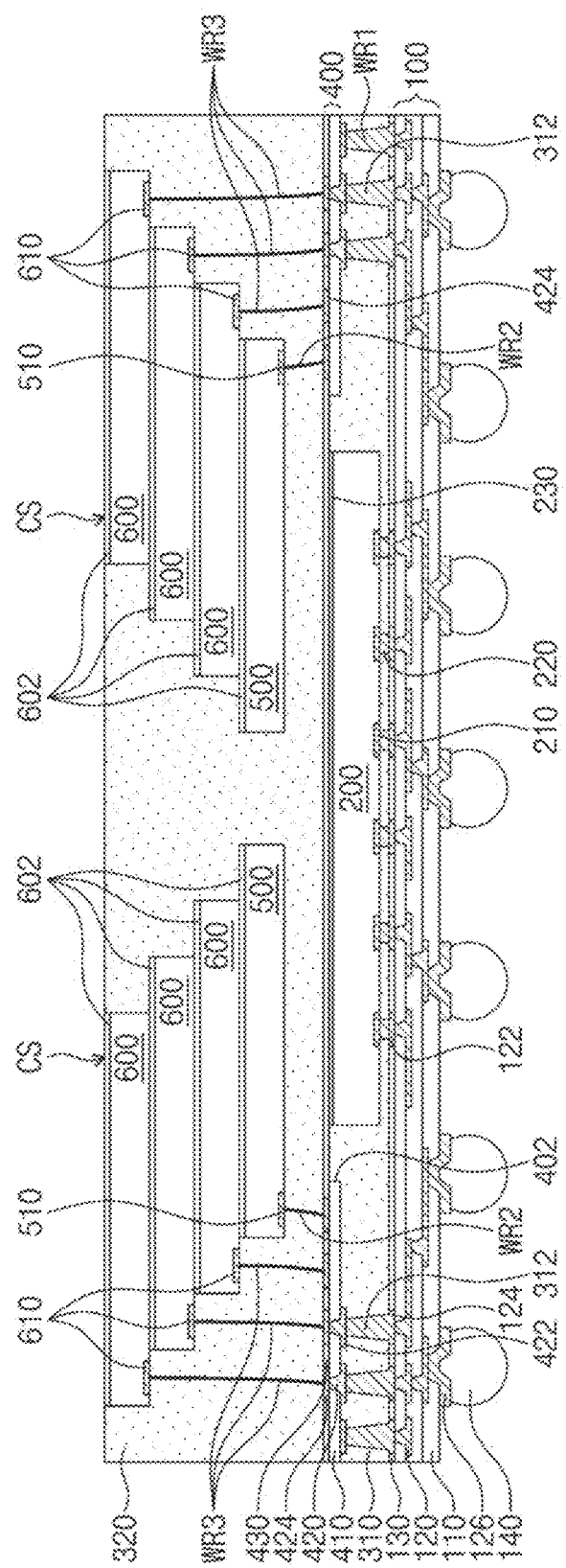

FIG. 8 is a cross-sectional view showing a semiconductor package according to some example embodiments of the present inventive concepts.

Referring to FIG. 8, the redistribution layer 400 may be electrically connected to the package substrate 100. For example, the first semiconductor chip 200 may be provided on its one side with a vertical connection terminal that connects the redistribution layer 400 to the package substrate 100. In example embodiments of FIG. 8, the vertical connection terminal may include through electrodes 312. The through electrodes 312 may be disposed on one side of the first semiconductor chip 200. The through electrodes 312 may vertically penetrate the first molding layer 310. The through electrodes 312 may have their ends that extend toward the package substrate 100 to be coupled to the second substrate pads 124 of the package substrate 100. The through electrodes 312 may have their other ends that extend toward the top surface of the first molding layer 310 to be coupled to the lower pads 422 of the redistribution layer 400. The through electrodes 312 may have a circular or polygonal pillar shape that vertically penetrates the first molding layer 310. In this description, the term "through via" may indicate a via that vertically penetrates a certain component, and no limitation is imposed on a planar shape of the "through via." For example, the shape of the "through via" may include a circular pillar shape, a polygonal pillar shape, a partition shape, or a wall shape. The through vias 312 may each have a width that decreases with increasing distance from the package substrate 100. Alternatively, the through electrodes 312 may each have a width that is constant regardless of distance from the package substrate 100. The through electrode 312 and the second substrate pads 124 may be formed into a single unitary piece. The through electrodes 312 may include metal. For example, the through electrodes 312 may include copper (Cu).

Figure 9:
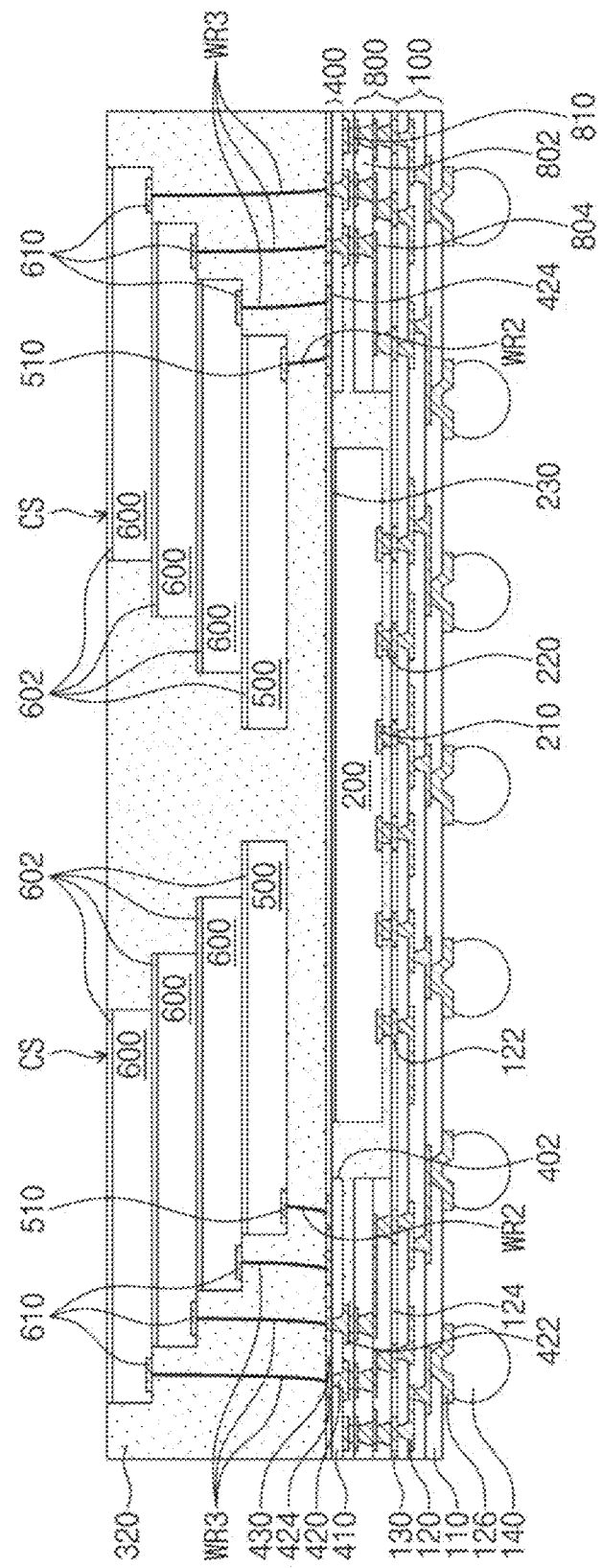

FIG. 9 is a cross-sectional view showing a semiconductor package according to some example embodiments of the present inventive concepts.

Referring to FIG. 9, the redistribution layer 400 may be electrically connected to the package substrate 100. For example, the first semiconductor chip 200 may be provided on its one side with a vertical connection terminal that connects the redistribution layer 400 to the package substrate 100. In example embodiments of FIG. 9, the vertical connection terminal may include a connection substrate 800.

The connection substrate 800 may have an opening that penetrates therethrough. For example, the opening may be shaped like an open hole that connects top and bottom surfaces of the connection substrate 800. The bottom surface of the connection substrate 800 may be in contact with the top surface of the package substrate 100. The connection substrate 800 may include a substrate base layer 802 and a conductive member 804 that is a wiring pattern provided in the substrate base layer 802. For example, the substrate base layer 802 may include silicon oxide (SiO). The conductive member 804 may be disposed closer than the opening to an outer portion of the connection substrate 800. The conductive member 804 may include connection substrate upper pads and connection substrate vias. The connection substrate upper pads may be disposed on an upper portion of the connection substrate 800. The connection substrate vias may penetrate the substrate base layer 802 and electrically connect with the connection substrate upper pads.

The connection substrate 800 may be mounted on the package substrate 100. For example, on a bottom surface of the substrate base layer 802, the connection substrate vias may be coupled to the second substrate pads 124 of the package substrate 100. Therefore, the connection substrate 800 may be electrically connected to the first semiconductor chip 200 and the external terminals 140.

The connection substrate 800 may be electrically connected to the redistribution layer 400. For example, the connection substrate 800 may be connected to the lower pads 422 of the redistribution layer 400 through connection substrate terminals 810 provided on the connection substrate upper pads.

The first semiconductor chip 200 may be disposed on the package substrate 100. The first semiconductor chip 200 may be disposed in the opening of the connection substrate 800.

The first molding layer 310 may fill a space between the connection substrate 800 and the first semiconductor chip 200. The first molding layer 310 may surround the first semiconductor chip 200 in the opening and may expose the top surface of the first semiconductor chip 200. The first molding layer 310 may fill a space between the redistribution layer 400 and the connection substrate 800.

FIGS. 10 to 28 are cross-sectional views showing a method of fabricating a semiconductor package according to some example embodiments of the present inventive concepts.

Figure 10:
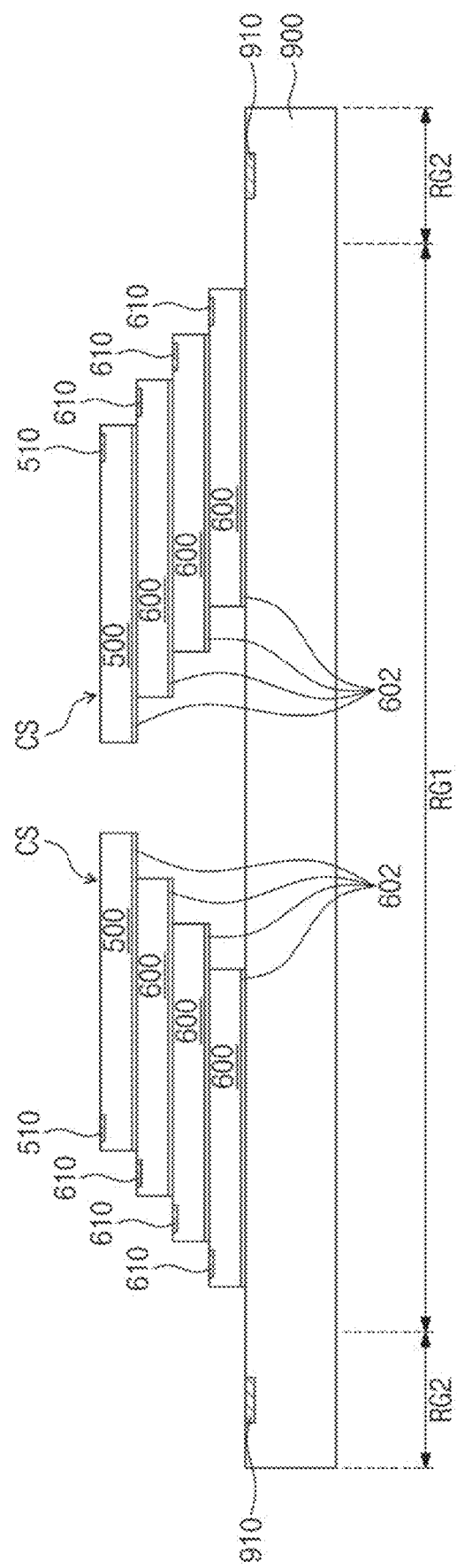
FIGS. 10 to 28 are cross-sectional views showing a method of fabricating a semiconductor package according to some example embodiments of the present inventive concepts.

Referring to FIG. 10, a carrier substrate 900 may be provided. The carrier substrate 900 may be a dielectric substrate including glass or polymer, or may be a conductive substrate including metal. The carrier substrate 900 may have a first region RG1 and a second region RG2 positioned outside the first region RG1. The first region RG1 may correspond to an area where a semiconductor package is formed, and the second region RG2 may correspond to an area which will be removed subsequently. When a plurality of semiconductor packages are formed on one carrier substrate 900, a plurality of first regions RG1 may be provided therebetween with the second region RG2 that defines the first regions RG1, and the second region RG2 may be an area on which a sawing process is performed to separate semiconductor packages from each other.

The carrier substrate 900 may include dummy pads 910 provided on a top surface thereof. The dummy pads 910 may be disposed on the second region RG2.

Although not shown, the carrier substrate 900 may be provided with an adhesive member on the top surface of the carrier substrate 900. For example, the adhesive member may include a glue tape.

The carrier substrate 900 may be provided thereon with chip stacks CS. The chip stacks CS may be attached to the carrier substrate 900. For one chip stack CS, a third semiconductor chip 600 may be attached through a second adhesion layer 602 to the carrier substrate 900, another third semiconductor chip 600 may be attached through another second adhesion layer 602 to the third semiconductor chip 600, and a second semiconductor chip 500 may be attached through another second adhesion layer 602 to the stacked third semiconductor chips 600. Alternatively, a lowermost third semiconductor chip 600 may not be provided with the second adhesion layer 602, and may be attached to the carrier substrate 900 through the adhesive member of the carrier substrate 900. The third semiconductor chips 600 and the second semiconductor chip 500 may be disposed in a face-up state. For example, rear surfaces (or inactive surfaces) of the third semiconductor chips 600 and a rear surface of the second semiconductor chip 500 may be directed toward the carrier substrate 900, and third chip pads 610 of the third semiconductor chips 600 and second chip pads 510 of the second semiconductor chip 500 may be disposed to stand opposite to the carrier substrate 900. In order to expose the third chip pads 610, the third semiconductor chips 600 and the second semiconductor chip 500 may be stacked and shifted in one direction parallel to the top surface of the carrier substrate 900. The chip stacks CS may be attached through the adhesive member to the carrier substrate 900. The chip stacks CS may be disposed spaced apart from each other on the carrier substrate 900.

Figure 11:
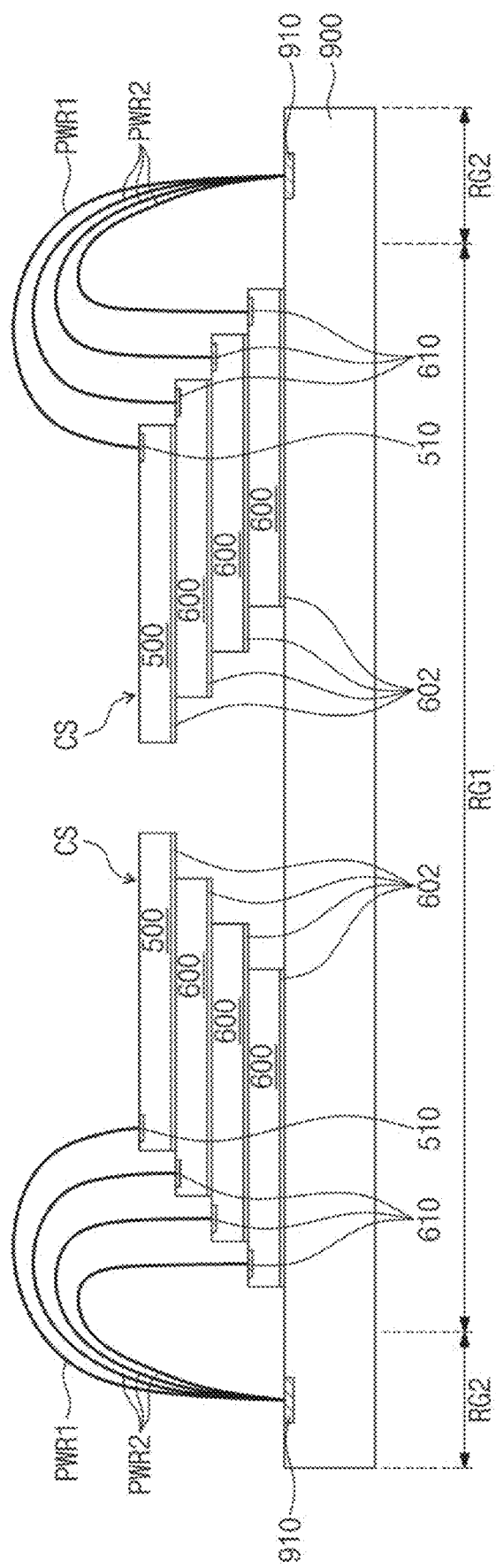

Referring to FIG. 11, the chip stacks CS may be wire-bonded. For example, the second semiconductor chip 500 and the third semiconductor chips 600 of each of the chip stacks CS may be coupled to the dummy pads 910 of the carrier substrate 900. For example, ends of first preliminary connection wires PWR1 may be coupled to the second chip pads 510 of the second semiconductor chip 500 included in each of the chip stacks CS. An angle between the second chip pad 510 and the first preliminary connection wire PWR1 may range from about 30° to about 90°. For example, the angle may be about 90°. Other ends of the first preliminary connection wires PWR1 may be coupled to the dummy pads 910. Each of the first preliminary connection wires PWR1 may have an uppermost end located at a higher level than that of top surfaces of the chip stacks CS. Ends of second preliminary connection wires PWR2 may be coupled to the third chip pads 610 of the third semiconductor chips 600 included in each of the chip stacks CS. An angle between the third chip pad 610 and the second preliminary connection wire PWR2 may range from about 30° to about 90°. For example, the angle may be about 90°. Other ends of the second preliminary connection wires PWR2 may be coupled to the dummy pads 910. Each of the second preliminary connection wires PWR2 may have an uppermost end located at a higher level than that of the top surfaces of the chip stacks CS. The first preliminary connection wires PWR1 and the second preliminary connection wires PWR2 may be coupled to the same dummy pads 910 as each other or to different dummy pads 910 from each other.

Figure 12:
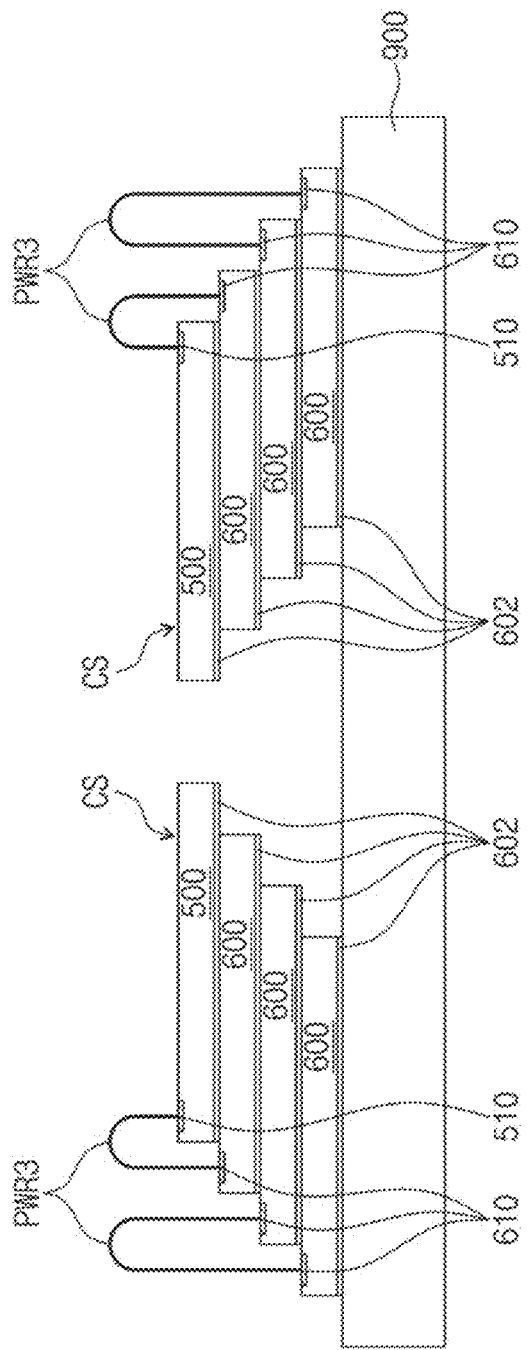

According to some example embodiments, the carrier substrate 900 may not have the dummy pads 910. As shown in FIG. 12, the second and third semiconductor chips 500 and 600 of each of the chip stacks CS may be wire-bonded to each other. For example, third preliminary connection wires PWR3 may be coupled to the second and third chip pads 510 and 610 of the second and third semiconductor chips 500 and 600. For example, one of the third preliminary connection wires PWR3 may connect to each other the third chip pads 610 of two adjacent ones among the third semiconductor chips 600, and others of the third preliminary connection wires PWR3 may connect the third chip pads 610 of an uppermost third semiconductor chip 600 to the second chip pads 510 of the second semiconductor chip 500. An angle between one of the second and third chip pads 510 and 610 and the third preliminary connection wire PWR3 may range from about 30° to about 90°. For example, the angle may be about 90°. Each of the third preliminary connection wires PWR3 may have an uppermost end located at a higher level than that of the top surfaces of the chip stacks CS.

Figure 13:
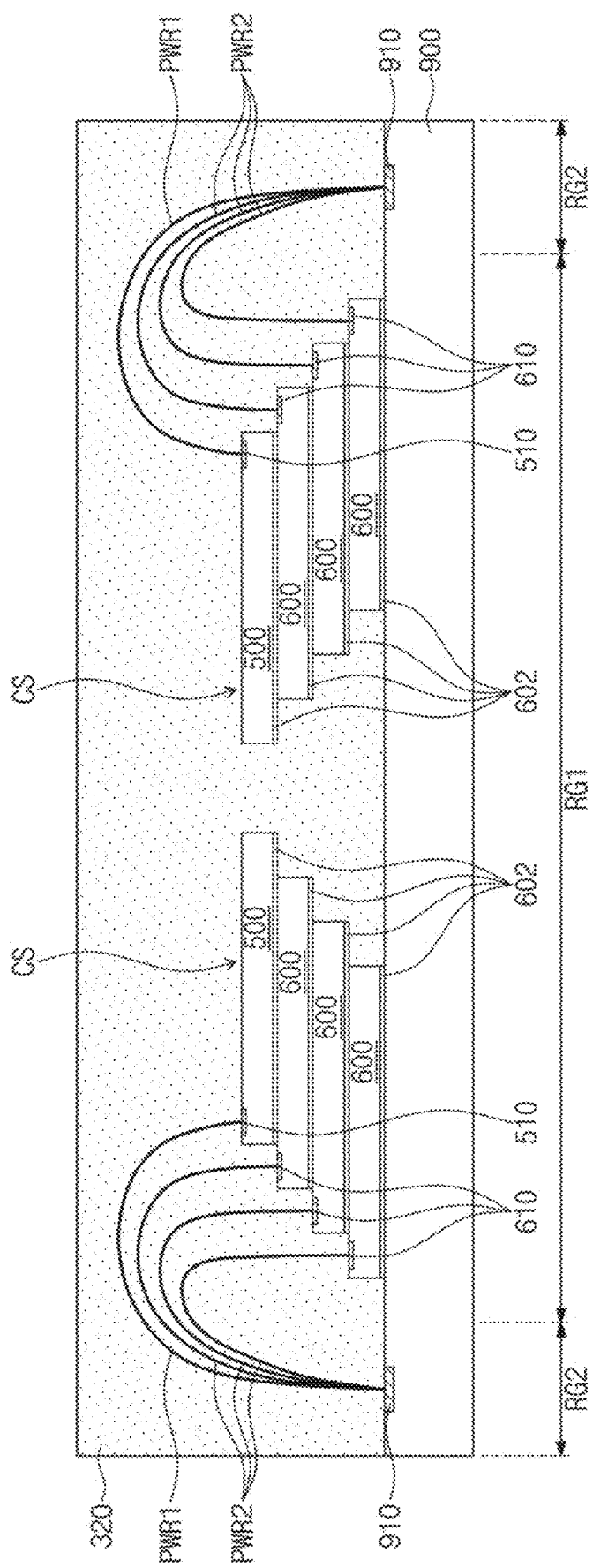

Referring to FIG. 13, a second molding layer 320 may be formed on the carrier substrate 900. For example, a molding material may be coated on the top surface of the carrier substrate 900 so as to encapsulate the chip stacks CS and the first and second preliminary connection wires PWR1 and PWR2, and the molding material may be cured to form the second molding layer 320. The molding material may include, for example, an epoxy molding compound (EMC).

Figure 14:
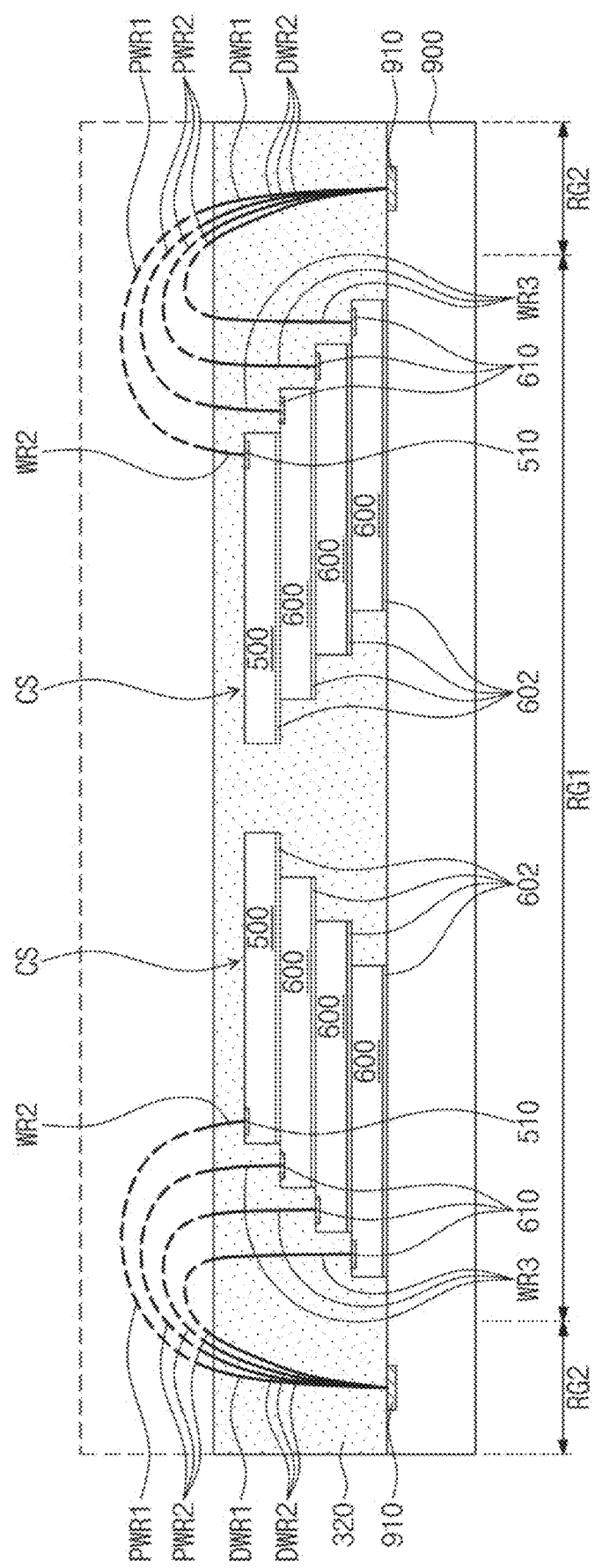

Referring to FIG. 14, a thinning process may be performed on the second molding layer 320. The thinning process may include a chemical mechanical polishing (CMP) process or a grinding process. The thinning process may cause the second molding layer 320 to have a lowered top surface. The first and second preliminary connection wires PWR1 and PWR2 may be exposed in the procedure of the thinning process. During the thinning process, exposed upper portions of the exposed first and second preliminary connection wires PWR1 and PWR2 may be partially removed. Therefore, the first preliminary connection wires PWR1 may be divided into second connection wires WR2 coupled to the second chip pads 510 and first dummy wires DWR1 coupled to the dummy pads 910, and the second preliminary connection wires PWR2 may be divided into third connection wires WR3 coupled to the third chip pads 610 and second dummy wires DWR2 coupled to the dummy pads 910. The second connection wires WR2 may upwardly extend from the second chip pads 510, and the third connection wires WR3 may upwardly extend from the third chip pads 610. Ends of the second connection wires WR2 and ends of the third connection wires WR3 may be exposed on the top surface of the second molding layer 320. The thinning process may be performed until the top surfaces of the chip stacks CS are exposed. For example, the chip stacks CS may be buried in the second molding layer 320 and may not be exposed on the top surface of the second molding layer 320.

Figure 15:
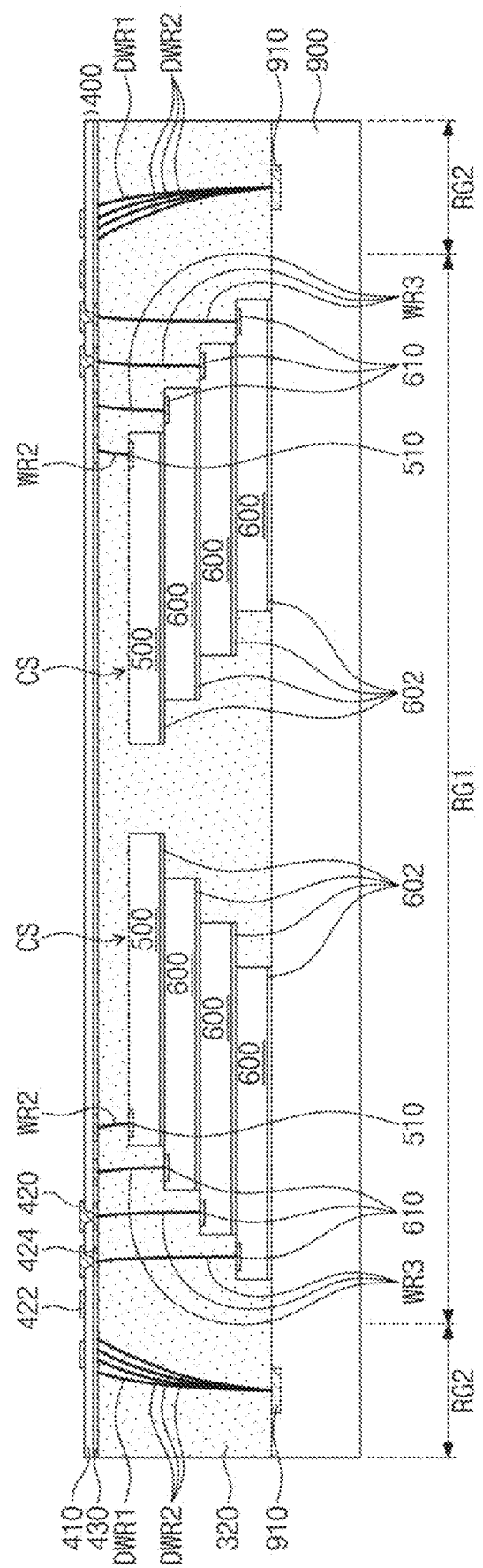

Referring to FIG. 15, a redistribution layer 400 may be formed. The following will describe in detail the formation of the redistribution layer 400.

A dielectric layer 430 may be formed on the second molding layer 320. The dielectric layer 430 may include a dielectric polymer or a photo-imageable dielectric. The dielectric layer 430 may correspond to the second passivation layer 430 discussed with reference to FIG. 1.

Upper pads 424 may be formed in the dielectric layer 430. For example, the dielectric layer 430 may be patterned to form openings for forming the upper pads 424. The openings may expose the second connection wires WR2 and the third connection wires WR3. Afterwards, a seed layer may be conformally formed in the openings, and the seed layer may be used as a seed to perform a plating process to form the upper pads 424 that fill the openings. The upper pads 424 may be coupled to the second connection wires WR2 and the third connection wires WR3.

A second dielectric pattern 410 may be formed on the dielectric layer 430. The second dielectric pattern 410 may be formed by a coating process such as spin coating or slit coating. The second dielectric pattern 410 may include a photo-imageable dielectric (PID). For example, the photo-imageable dielectric may include at least one selected from photosensitive polyimide, polybenzoxazole (PBO), phenolic polymers, and benzocyclobutene polymers.

Openings may be formed in the second dielectric pattern 410. For example, the second dielectric pattern 410 may be patterned to form the openings. The openings may expose the upper pads 424.

A second conductive pattern 420 may be formed. For example, a barrier layer and a conductive layer may be formed on the second dielectric pattern 410 so as to cover a top surface of the second dielectric pattern 410 and to fill the openings, and then the barrier layer and the conductive layer may be patterned to form the second conductive pattern 420.

Therefore, a redistribution layer 400 may be formed which has the second dielectric pattern 410 and the second conductive pattern 420. When the redistribution layer 400 includes a plurality of substrate wiring layers, the formation of the second dielectric pattern 410 and the second conductive pattern 420 may be repeatedly performed. A portion of a head part of the second conductive pattern 420 positioned on the top surface of the second dielectric pattern 410 may correspond to lower pads 422 of the redistribution layer 400.

According to some example embodiments of the present inventive concepts, a relatively simple wiring process may be used to form a vertical connection terminal to connect the chip stacks CS to the redistribution layer 400, and thus a semiconductor package fabrication method may be simplified and abbreviated. In particular, the second and third connection wires WR2 and WR3 may have a small amount of conductive material, compared to connection terminals such as solder balls, solder bumps, and through vias, and positions of ends of the second and third connection wires WR2 and WR3 may be easily changed according to the wiring process. For example, there may be provided a semiconductor package fabrication method whose cost is reduced and which has higher degree of freedom of wiring design.

In addition, because the upper pads 424 with large areas are formed on the second and third connection wires WR2 and WR3 with small cross-sectional areas, there may be no misalignment between the upper pads 424 and the second and third connection wires WR2 and WR3, and there may be constant contact areas between the upper pads 424 and the second and third connection wires WR2 and WR3, with the result that semiconductor packages may be provided with uniform electrical properties.

According to some example embodiments, the thinning process may be performed until the top surfaces of the chip stacks CS are exposed.

Figure 16:
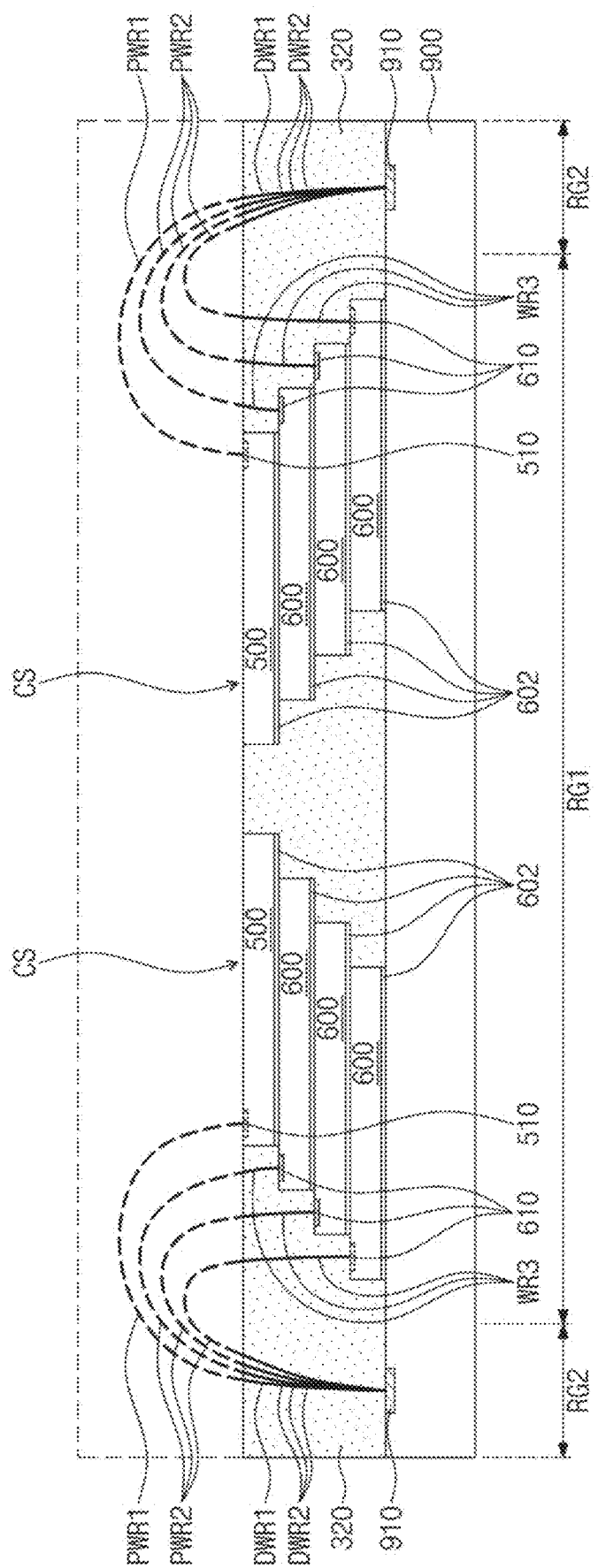

Referring to FIG. 16, the thinning process may be continuously performed on a resultant structure of FIG. 14. After the thinning process, the top surfaces of the chip stacks CS may be exposed. Therefore, a top surface of the second semiconductor chip 500 may be exposed, and the second chip pads 510 of the second semiconductor chip 500 may also be exposed. The thinning process may be performed until the top surface of the second semiconductor chip 500, and thus the second connection wires WR2 may not be formed. If necessary, when the chip stacks CS are wire-bonded, the first preliminary connection wires PWR1 may not be formed.

Figure 17:
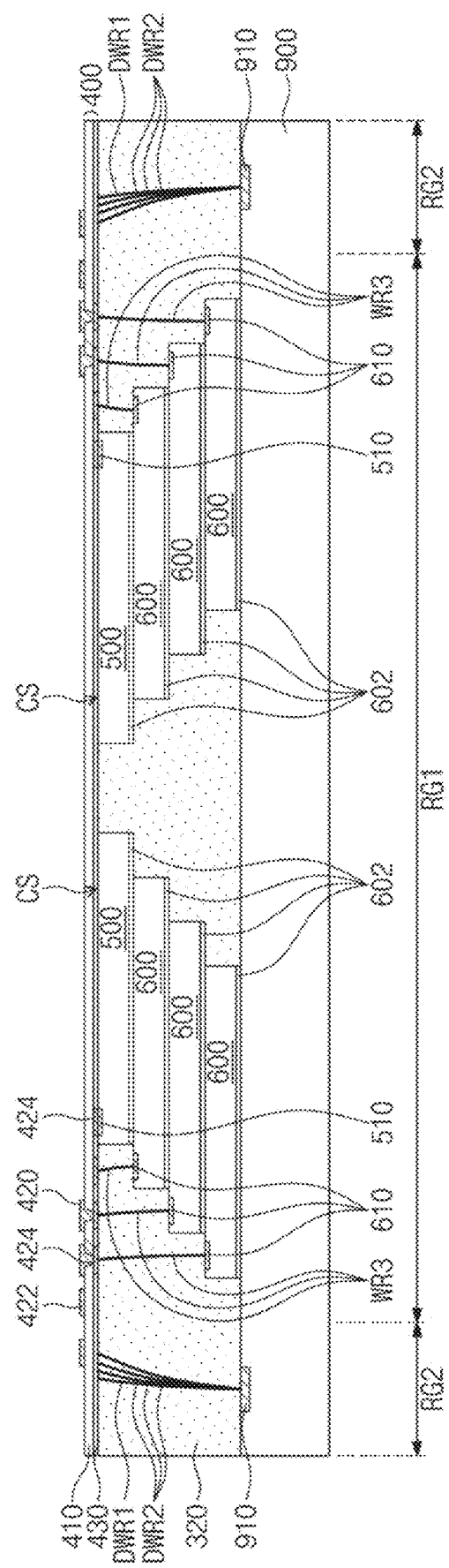

Referring to FIG. 17, a redistribution layer 400 may be formed on a resultant structure of FIG. 16. For example, a dielectric layer 430 may be formed on the second molding layer 320. Upper pads 424 may be formed in the dielectric layer 430. For example, the dielectric layer 430 may be patterned to form openings that expose the second chip pads 510 and the third connection wires WR3, a seed layer may be conformally formed in the openings, and then the seed layer may be used to perform a plating process to form the upper pads 424 that fill the openings. The upper pads 424 may be coupled to the second chip pads 510 and the third connection wires WR3. A second dielectric pattern 410 may be formed on the dielectric layer 430, and openings may be formed in the second dielectric pattern 410. A barrier layer and a conductive layer may be formed on the second dielectric pattern 410 so as to cover a top surface of the second dielectric pattern 410 and to fill the openings, and then the barrier layer and the conductive layer may be patterned to form a second conductive pattern 420. In example embodiments of FIGS. 16 and 17, there may be fabricated a semiconductor package discussed with reference to FIG. 6.

According to some example embodiments, the upper pads 424 may be formed to have large contact areas with the second and third connection wires WR2 and WR3.

Figure 18:
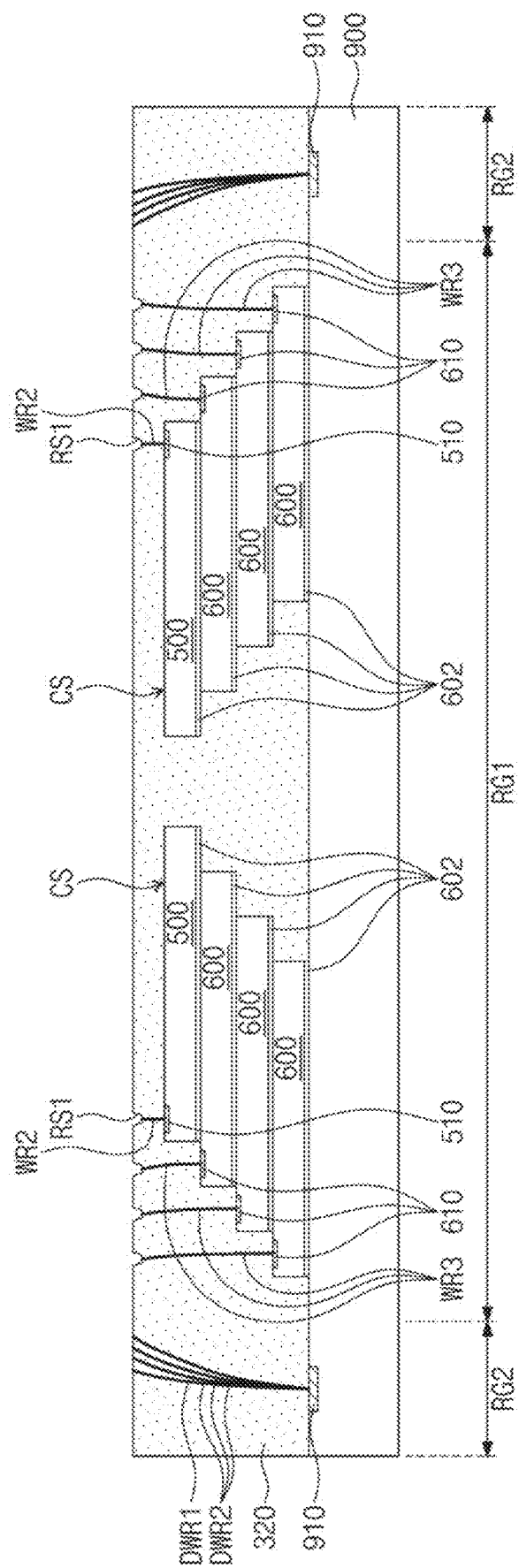

Referring to FIG. 18, a patterning process may be performed on the second molding layer 320 of a resultant structure depicted in FIG. 14. The patterning process may form first recesses RS1 that extend from the top surface of the second molding layer 320 toward an inside of the second molding layer 320. The first recesses RS1 may expose the second connection wires WR2 and the third connection wires WR3. For a resultant structure of FIG. 14, the second and third connection wires WR2 and WR3 may be exposed on the top surface of the second molding layer 320, and ends of the second and third connection wires WR2 and WR3 may be located at the same level as that of the top surface of the second molding layer 320. Therefore, after the patterning process, portions of the second and third connection wires WR2 and WR3 may remain in the first recesses RS1. For example, the second and third connection wires WR2 and WR3 may upwardly protrude from bottom surfaces of the first recesses RS1.

Figure 19:
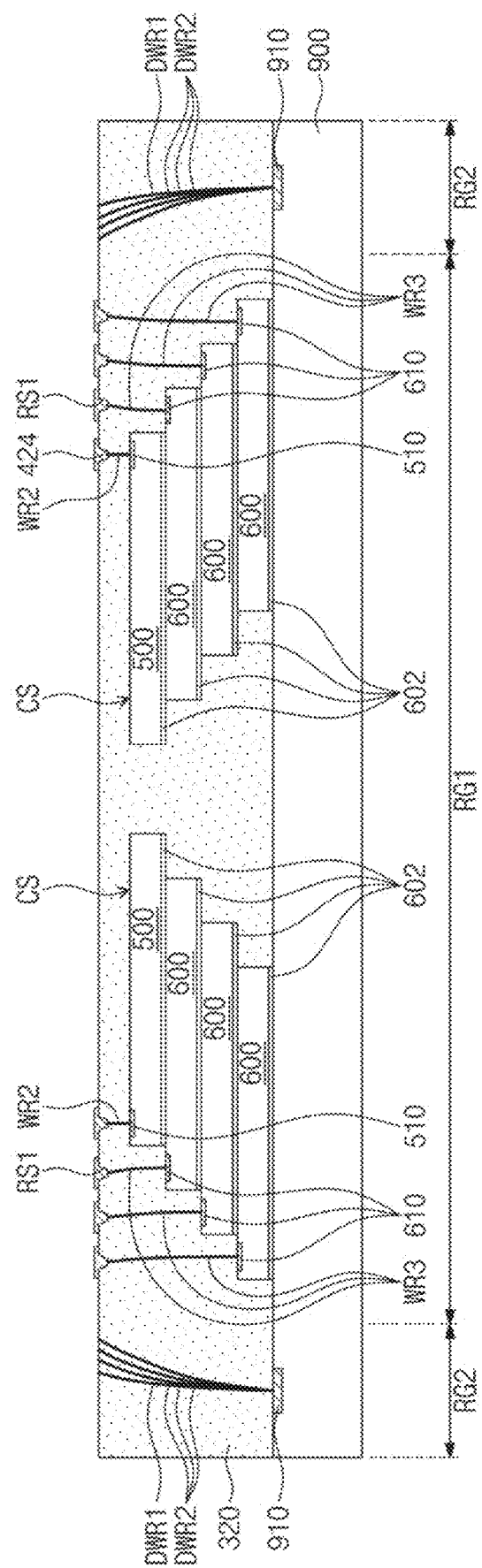

Referring to FIG. 19, a redistribution layer 400 may be performed on a resultant structure of FIG. 18. For example, a dielectric layer 430 may be formed on the second molding layer 320. Upper pads 424 may be formed in the dielectric layer 430. For example, the dielectric layer 430 may be patterned to form openings that expose the first recesses RS1, a seed layer may be conformally formed in the first recesses RS1 and the openings, and then the seed layer may be used to perform a plating process to form the upper pads 424 that fill the first recesses RS1 and the openings. The openings may have their widths greater than those of the first recesses RS1, and the upper pads 424 may each have a "T" shape that has a head part on the top surface of the second molding layer 320 and a tail part inserted into the second molding layer 320. The upper pads 424 may fill the openings and the first recesses RS1, and may surround the second and third connection wires WR2 and WR3 in the first recesses RS1. A second dielectric pattern 410 may be formed on the dielectric layer 430, and openings may be formed in the second dielectric pattern 410. A barrier layer and a conductive layer may be formed on the second dielectric pattern 410 so as to cover a top surface of the second dielectric pattern 410 and to fill the openings, and then the barrier layer and the conductive layer may be patterned to form a second conductive pattern 420. In example embodiments of FIGS. 18 and 19, there may be fabricated a semiconductor package discussed with reference to FIGS. 4 and 5. The following description will focus on example embodiments of FIG. 15.

Figure 20:
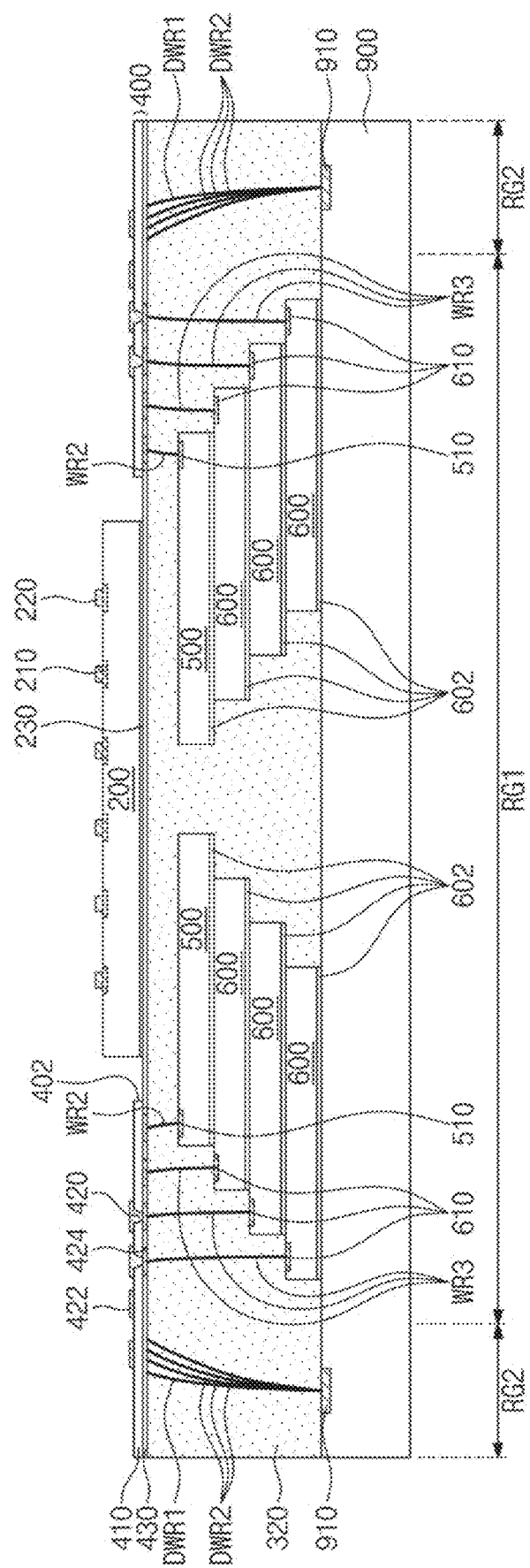
Figure 21:
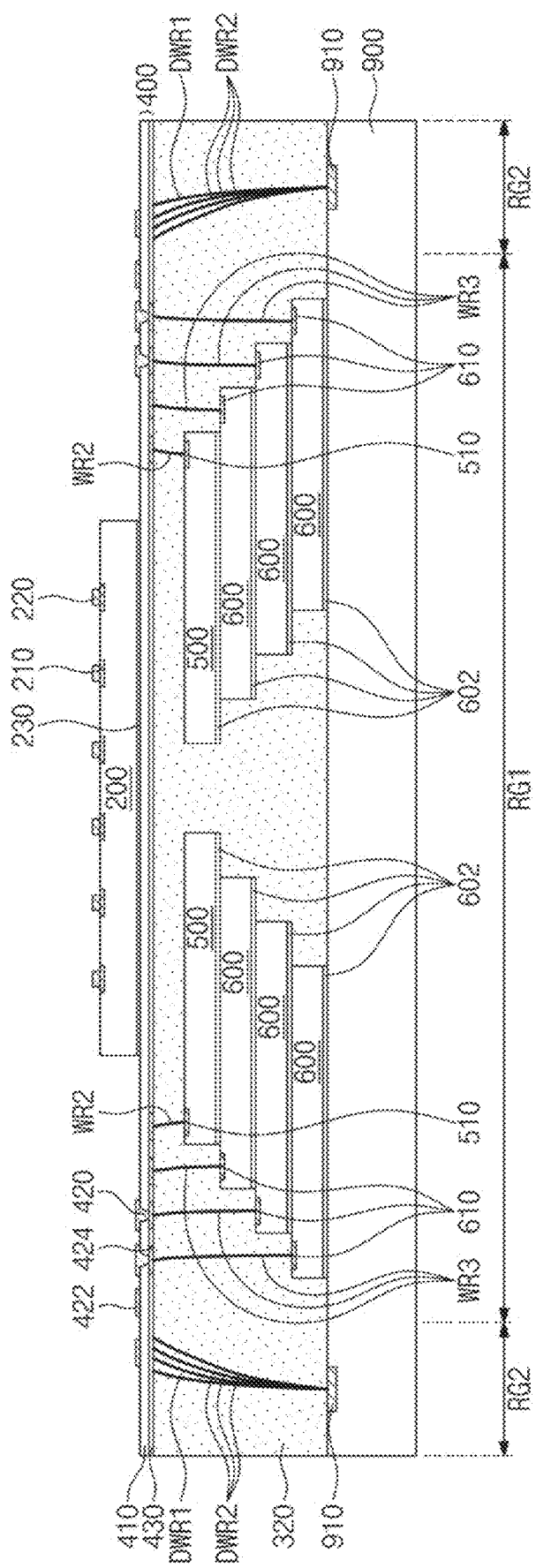

Referring to FIG. 20, a first semiconductor chip 200 may be attached to the redistribution layer 400. For example, a portion of the second dielectric pattern 410 of the redistribution layer 400 may be removed to form a chip insertion portion 402. The chip insertion portion 402 may be formed to completely and vertically penetrate the second dielectric pattern 410 or to partially penetrate a lower portion of the second dielectric pattern 410. A first adhesion layer 230 may be provided on a rear surface of the first semiconductor chip 200, and the first semiconductor chip 200 may be attached through the first adhesion layer 230 to a bottom surface of the chip insertion portion 402. For example, the first semiconductor chip 200 may be disposed in a face-up state in the chip insertion portion 402. Alternatively, as shown in FIG. 21, the chip insertion portion 402 may not be formed in the redistribution layer 400, and the first semiconductor chip 200 may be attached through the first adhesion layer 230 to the top surface of the second dielectric pattern 410.

Afterwards, on a top surface of the first semiconductor chip 200, first chip terminals 220 may be provided on the first chip pads 210. The first chip terminals 220 may include a solder bump.

Figure 22:
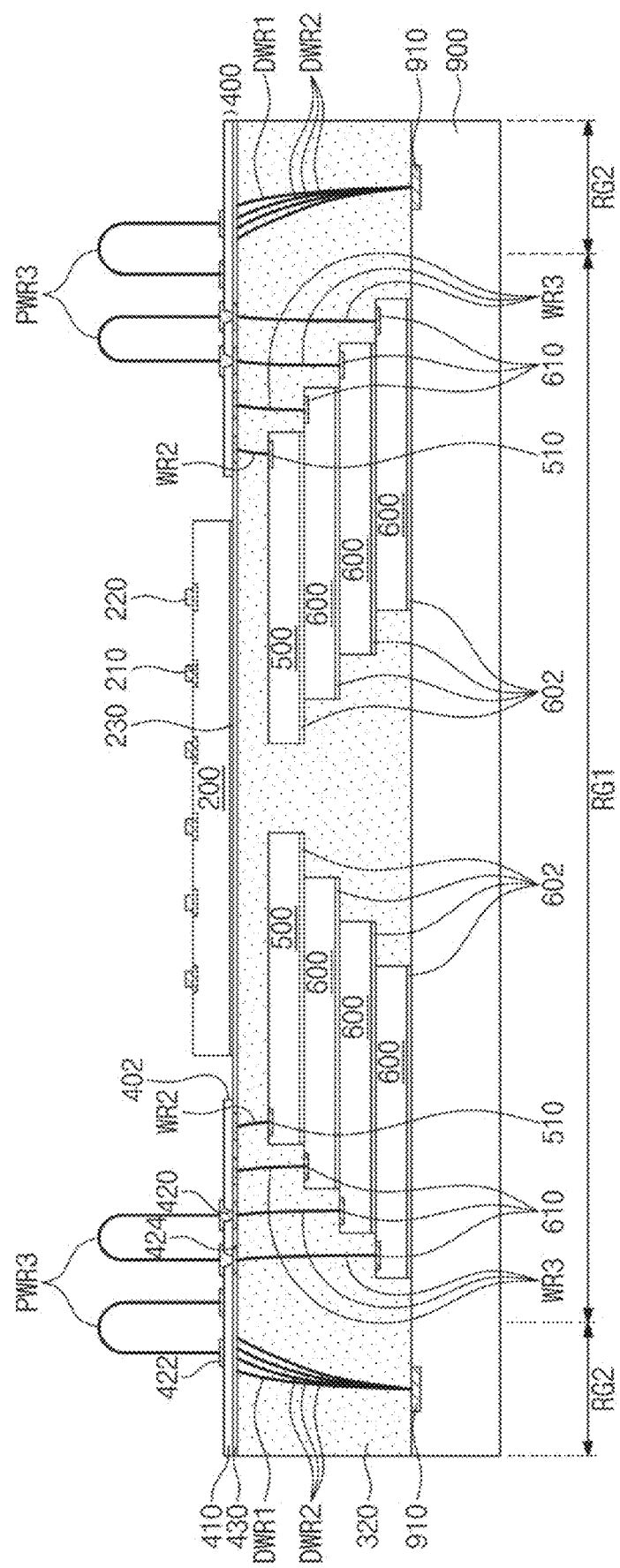

Referring to FIG. 22, the redistribution layer 400 may be wire-bonded. For example, lower pads 422 of the redistribution layer 400 may be connected to each other through third preliminary connection wires PWR3. Ends of the third preliminary connection wires PWR3 may be coupled to one of the lower pads 422, and other ends of the third preliminary connection wires PWR3 may be coupled to another of the lower pads 422. In some example embodiments, an angle between the lower pad 422 and the third preliminary connection wire PWR3 may range from about 30° to about 90°. For example, the angle may be about 90°. Each of the third preliminary connection wires PWR3 may have an uppermost end located at a higher level than that of the top surface of the first semiconductor chip 200. For example, the uppermost end of each of the third preliminary connection wires PWR3 may be located at a higher level than that of top surfaces of the first chip terminals 220.

Figure 23:
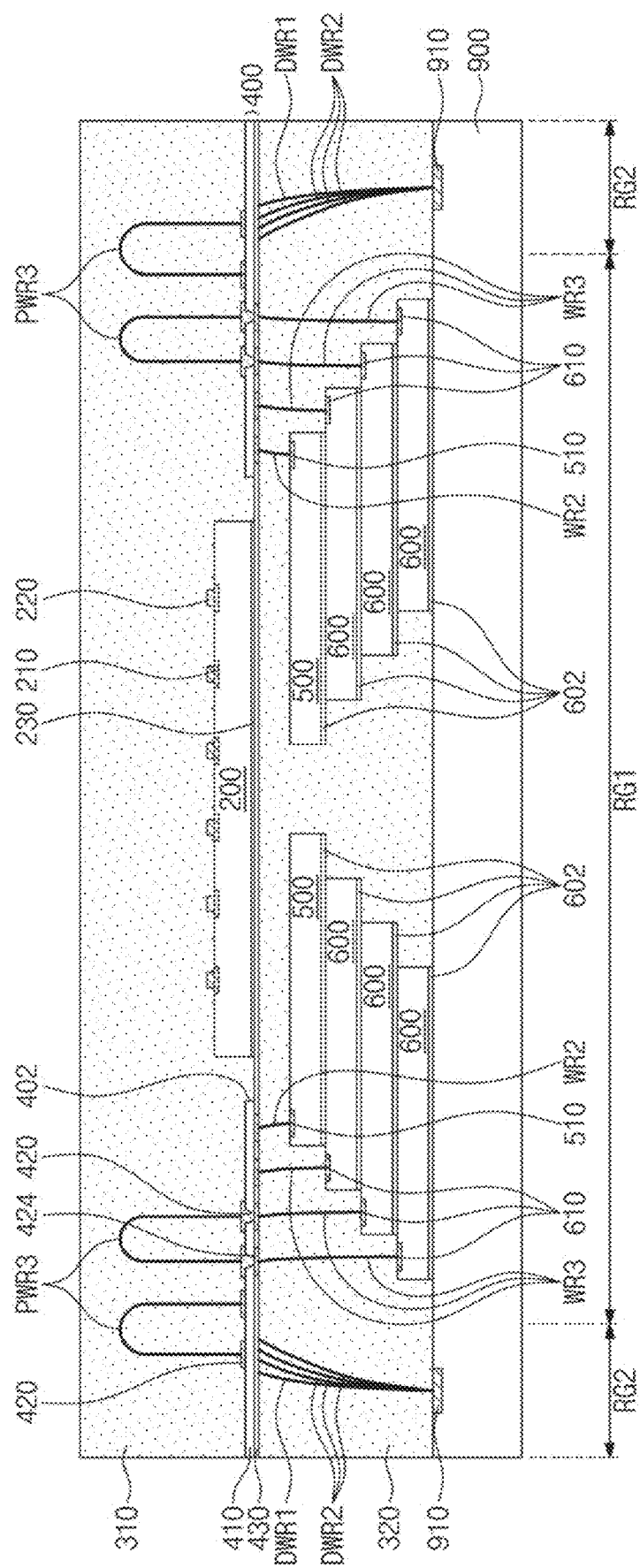

Referring to FIG. 23, a first molding layer 310 may be formed on the redistribution layer 400. For example, a molding material may be coated on a top surface of the redistribution layer 400 so as to encapsulate the first semiconductor chip 200 and the third preliminary connection wires PWR3, and the molding material may be cured to form the first molding layer 310. The molding material may include, for example, an epoxy molding compound (EMC).

Figure 24:
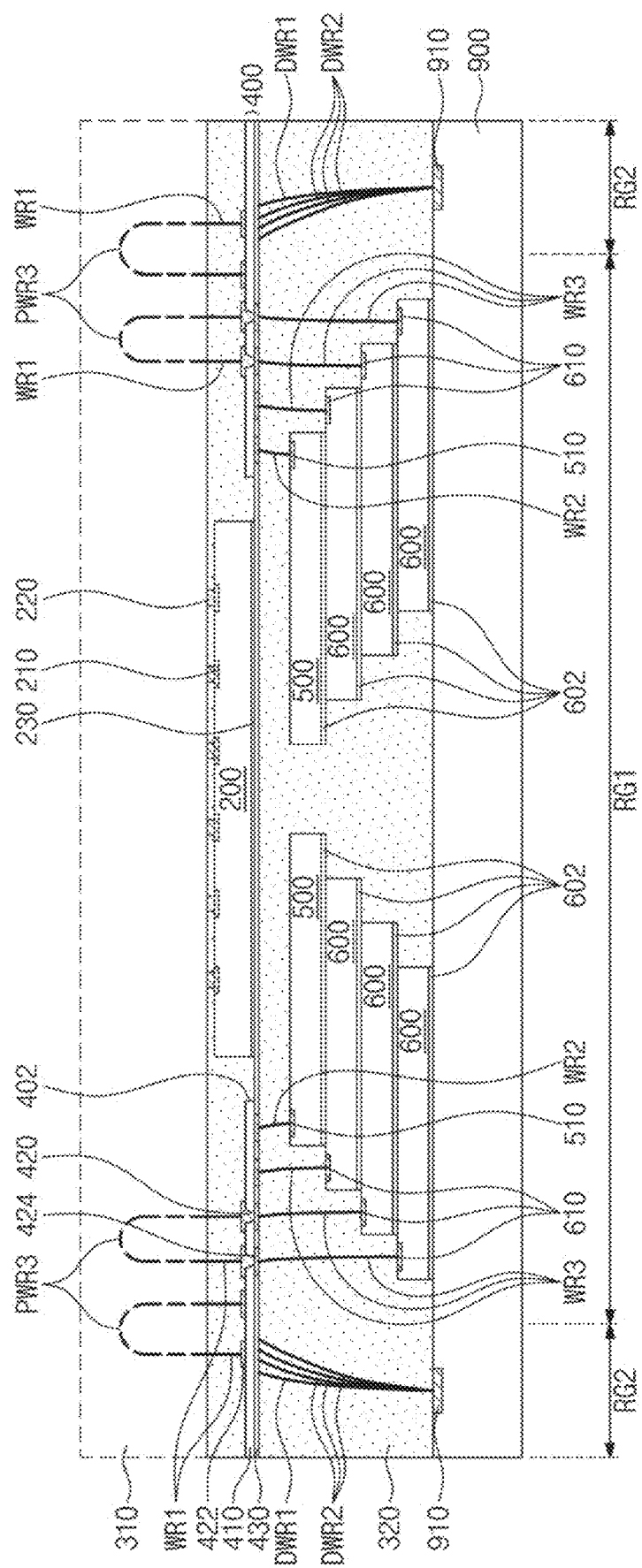

Referring to FIG. 24, a thinning process may be performed on the first molding layer 310. The thinning process may include a chemical mechanical polishing (CMP) process or a grinding process. The thinning process may cause the first molding layer 310 to have a lowered top surface. The third preliminary connection wires PWR3 may be exposed in the procedure of the thinning process. During the thinning process, exposed upper portions of the third preliminary connection wires PWR3 may be partially removed. Therefore, the third preliminary connection wires PWR3 may be divided into first connection wires WR1 coupled to the lower pads 422. The first connection wires WR1 may upwardly extend from the lower pads 422. Ends of the first connection wires WR1 may be exposed on the top surface of the first molding layer 310. The thinning process may be performed until exposure of the top surfaces of the first chip terminals 220 included in the first semiconductor chip 200.

Figure 25:
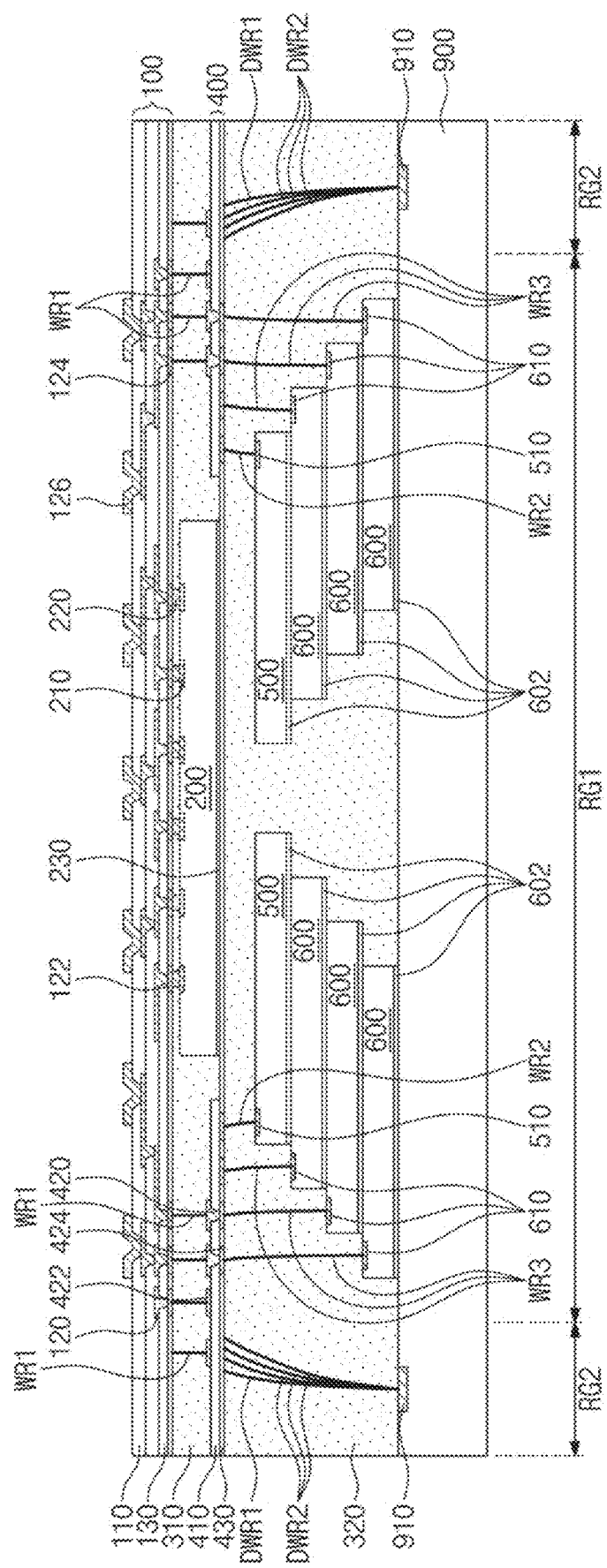

Referring to FIG. 25, a package substrate 100 may be formed on the first molding layer 310, and thus a semiconductor package may be fabricated. The following will describe in detail the formation of the package substrate 100.

A dielectric layer 130 may be formed on the first molding layer 310. The dielectric layer 130 may include a dielectric polymer or a photo-imageable dielectric. The dielectric layer 130 may correspond to the first passivation layer 130 formed on the first dielectric pattern 110 in an uppermost one of the substrate wiring layers discussed with reference to FIG. 1.

Substrate pads 122 and 124 may be formed in the dielectric layer 130. For example, the dielectric layer 130 may be patterned to form openings for forming the substrate pads 122 and 124. The openings may expose the first connection wires WR1 and the first chip terminals 220. Afterwards, a seed layer may be conformally formed in the openings, and the seed layer may be used as a seed to perform a plating process to form the substrate pads 122 and 124 that fill the openings. First substrate pads 122 may be coupled to the first chip terminals 220, and second substrate pads 124 may be coupled to the first connection wires WR1.

A first dielectric pattern 110 may be formed on the dielectric layer 130. The first dielectric pattern 110 may be formed by a coating process such as spin coating or slit coating. The first dielectric pattern 110 may include a photo-imageable dielectric (PID). For example, the photo-imageable dielectric may include at least one selected from photosensitive polyimide, polybenzoxazole (PBO), phenolic polymers, and benzocyclobutene polymers.

Openings may be formed in the first dielectric pattern 110. For example, the first dielectric pattern 110 may be patterned to form the openings. The openings may expose the first and second substrate pads 122 and 124.

A first conductive pattern 120 may be formed. For example, a barrier layer and a conductive layer may be formed on the first dielectric pattern 110 so as to fill the openings, and then the barrier layer and the conductive layer may undergo a planarization process to form the first conductive pattern 120.

Therefore, a substrate wiring layer may be formed which has the first dielectric pattern 110 and the first conductive pattern 120. The formation of the substrate wiring layer may be repeated to form a package substrate 100 in which the substrate wiring layers are stacked. The first conductive pattern 120 of an uppermost substrate wiring layer may correspond to external pads 126 of the package substrate 100.

According to some example embodiments, the second substrate pads 124 may be formed to large contact area with the first connection wires WR1.

Figure 26:
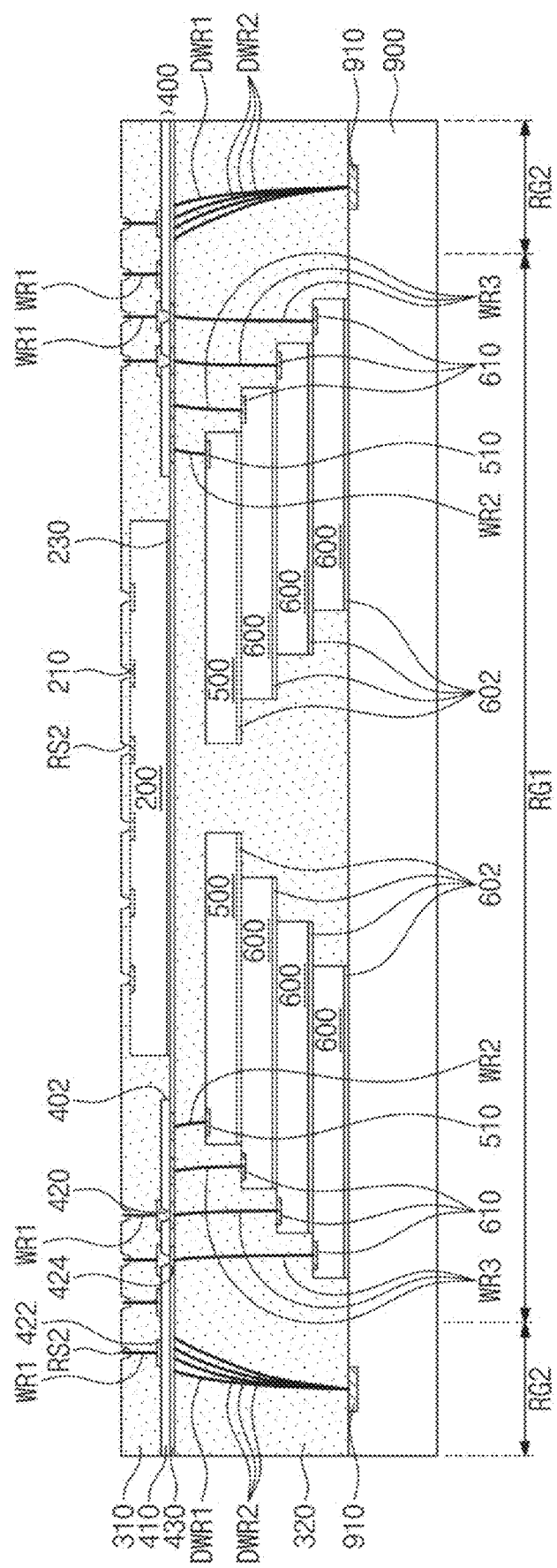

Referring to FIG. 26, a patterning process may be performed on the first molding layer 310 of a resultant structure depicted in FIG. 24. The patterning process may form second recesses RS2 that extend from the top surface of the first molding layer 310 toward an inside of the first molding layer 310. The second recesses RS2 may expose the first connection wires WR1 and the first chip pads 210. For a resultant structure of FIG. 24, the first connection wires WR1 may be exposed on the top surface of the first molding layer 310, and ends of the first connection wires WR1 may be located at the same level as that of the top surface of the first molding layer 310. Therefore, after the patterning process, portions of the first connection wires WR1 and WR3 may remain in the second recesses RS2. For example, the first connection wires WR1 may upwardly protrude from bottom surfaces of the second recesses RS2.

Figure 27:
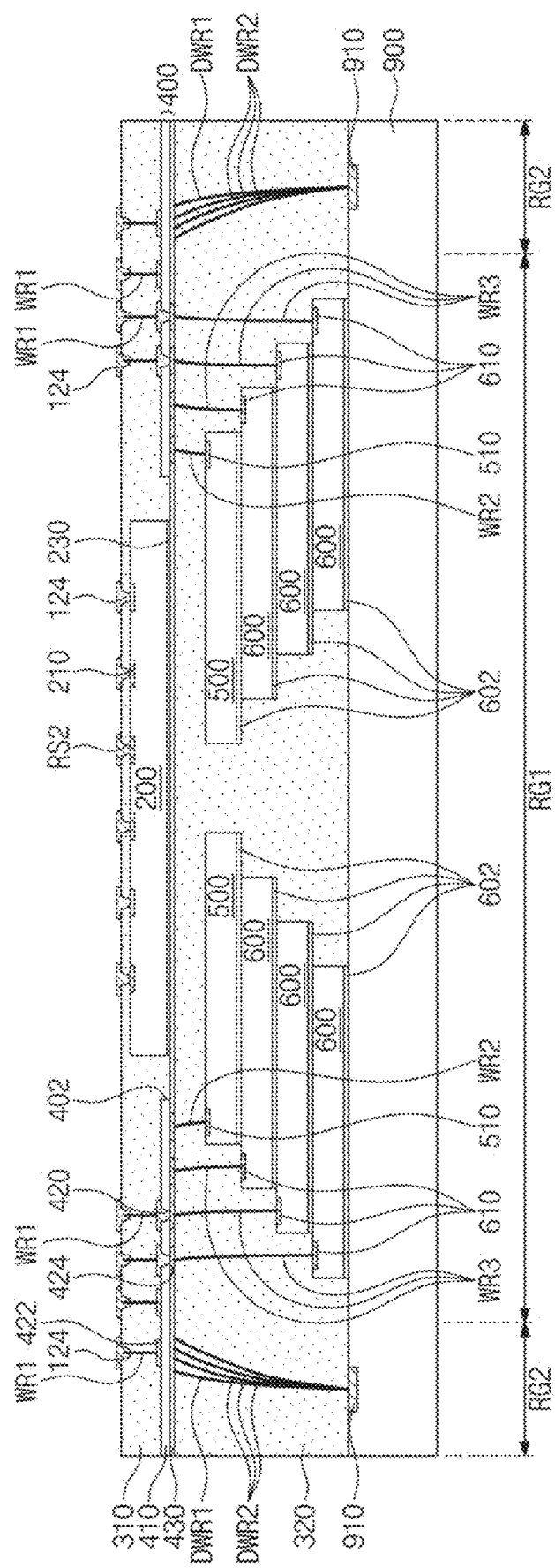

Referring to FIG. 27, substrate pads 122 and 124 may be formed on a resultant structure of FIG. 26. For example, a dielectric layer 130 may be formed on the first molding layer 310. The substrate pads 122 and 124 may be formed in the dielectric layer 130. For example, the dielectric layer 130 may be patterned to form openings that expose the second recesses RS2, a seed layer may be conformally formed in the second recesses RS2 and the openings, and then the seed layer may be used to perform a plating process to form the substrate pads 122 and 124 that fill the second recesses RS2 and the openings. The openings may have their widths greater than those of the second recesses RS2, and the substrate pads 122 may each have a "T" shape that has a head part on the top surface of the first molding layer 310 and a tail part inserted into the first molding layer 310. The substrate pads 122 and 124 may fill the openings and the second recesses RS2. First substrate pads 122 may be coupled to the first chip pads 210. Second substrate pads 124 may be coupled to the first connection wires WR1, and may surround the second and third connection wires WR2 and WR3 in the second recesses RS2. The following description will focus on example embodiments of FIG. 25.

Figure 28:
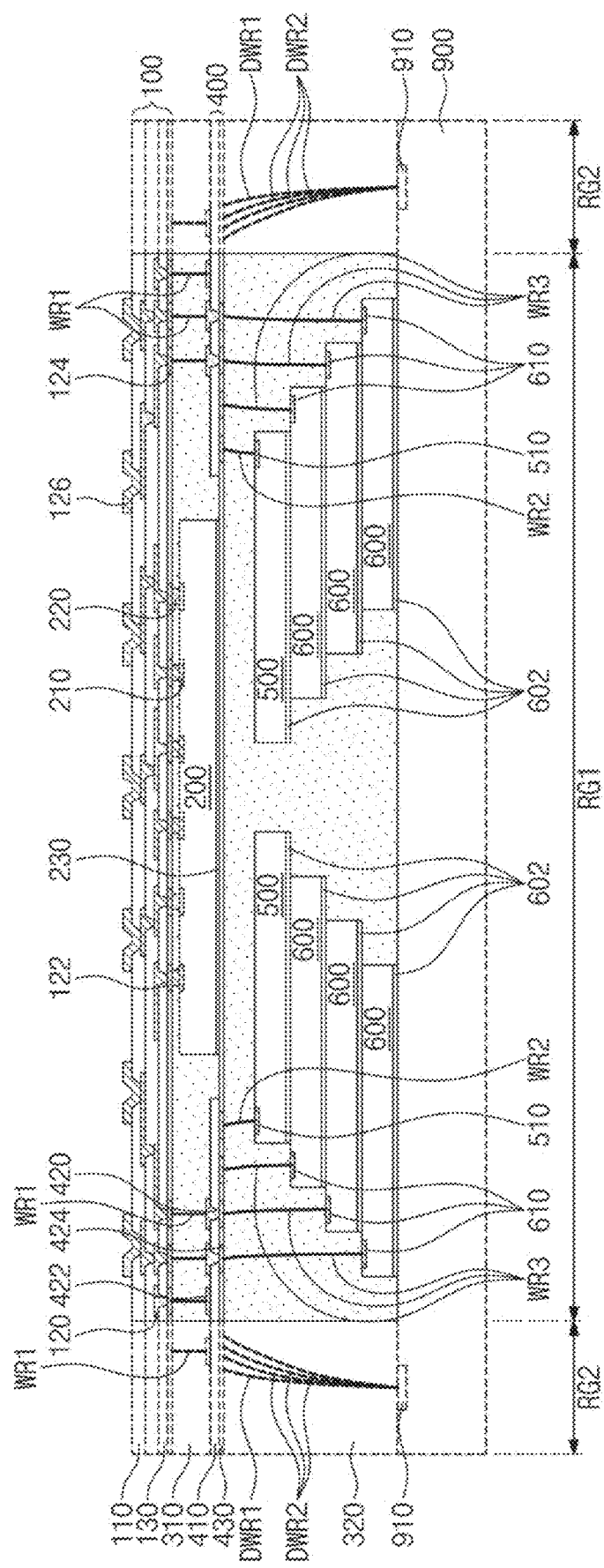

Referring to FIG. 28, the carrier substrate 900 may be removed.

The second region RG2 may undergo a sawing process to fabricate a semiconductor package with a required size. The removal of the second region RG2 may remove the first dummy wires DWR1 and the second dummy wires DWR2. According to some example embodiments, the sawing process may not be performed on the second region RG2. For example, the fabricated semiconductor package may include the first dummy wires DWR1 and the second dummy wires DWR2. The first dummy wires DWR1 and the second dummy wires DWR2 may be electrically insulated from the chip stacks CS, the first semiconductor chip 200, and the package substrate 100, and thus electrical properties of the semiconductor package may not be deteriorated even when the semiconductor package includes the first dummy wires DWR1 and the second dummy wires DWR2.

A semiconductor package according to some example embodiments of the present inventive concepts may be configured such that a semiconductor chip may be inserted into a chip insertion portion that is formed by partially removing a dielectric pattern of a redistribution layer. Therefore, there may be a reduction in overall thickness occupied by the semiconductor chip and the redistribution layer, and there may be provided a more compact-sized semiconductor package.

In addition, connection wires for mounting of chip stacks may vertically extend toward the redistribution layer from bottom surfaces of semiconductor chips, and therefore the connection wires may decrease in length and the semiconductor package may increase in electrical properties. In addition, the connection wires with small diameters may have extremely small planar areas, which may result in an advantage in increasing integration of the semiconductor package.

In a method of fabricating the semiconductor package according to some example embodiments of the present inventive concepts, a relatively simple wiring process may be used to form a vertical connection terminal to connect the chip stacks to the redistribution layer, and thus the semiconductor package fabrication method may be simplified and abbreviated. In particular, because the connection wires have small amounts of conductive material, it may be possible to easily change positions of ends of the connection wires and to provide a semiconductor package fabrication method whose cost is reduced and/or which has higher degree of freedom of wiring design.

In addition, because pads with large areas are formed on the connection wires with small cross-sectional areas, there may be no misalignment between the pads and the connection wires, and there may be constant contact areas between the pads and the connection wires, with the result that the semiconductor packages may be provided with more uniform electrical properties.

Although the present inventive concepts have been described in connection with some example embodiments of the present inventive concepts illustrated in the accompanying drawings, it will be understood by one of ordinary skill in the art that variations in form and detail may be made therein without departing from the spirit and essential feature of the present inventive concepts. The above disclosed example embodiments should thus be considered illustrative and not restrictive.

What is claimed is:

1. A semiconductor package, comprising:
a package substrate;
a redistribution layer on the package substrate;
a vertical connection terminal that connects the package substrate to the redistribution layer;
a first semiconductor chip between the package substrate and the redistribution layer;
a first molding layer that fills a space between the package substrate and the redistribution layer, wherein the redistribution layer covers the first molding layer and the first semiconductor chip, and the first semiconductor chip is on a first side of the redistribution layer;
a second semiconductor chip on the redistribution layer;
a third semiconductor chip on the second semiconductor chip;
a first connection wire that directly and vertically connects the redistribution layer to a first chip pad of the third semiconductor chip, the first chip pad is beside the second semiconductor chip and on a bottom surface of the third semiconductor chip; and
a second molding layer on the redistribution layer, wherein the second molding layer covers the second semiconductor chip and the third semiconductor chip, and the second semiconductor chip and the third semiconductor chip are on a second side of the redistribution layer opposite the first side of the redistribution layer, and
wherein the first molding layer is in contact with a bottom surface of the redistribution layer.

2. The semiconductor package of claim 1, wherein an entirety of the first connection wire is between the redistribution layer and the bottom surface of the third semiconductor chip.

3. The semiconductor package of claim 1, further comprising a second connection wire that directly and vertically connects the redistribution layer to a second chip pad, the second chip pad is on a bottom surface of the second semiconductor chip.

4. The semiconductor package of claim 3, wherein the second connection wire is between the redistribution layer and the bottom surface of the second semiconductor chip.

5. The semiconductor package of claim 1, wherein an angle between the first connection wire and the bottom surface of the third semiconductor chip or between the first connection wire and a top surface of the redistribution layer is in a range of about 30° to about 90°.

6. The semiconductor package of claim 1, wherein
a bottom surface of the second semiconductor chip is in contact with a top surface of the redistribution layer, and
a second chip pad of the second semiconductor chip is directly connected to a substrate pad of the redistribution layer.

7. The semiconductor package of claim 1, wherein the vertical connection terminal includes a third connection wire that directly connects the redistribution layer to the package substrate.

8. The semiconductor package of claim 1, wherein the vertical connection terminal includes a through electrode that vertically penetrates the first molding layer.

9. The semiconductor package of claim 1, further comprising a connection substrate between the package substrate and the redistribution layer, the connection substrate having an opening that penetrates the connection substrate,
wherein the first semiconductor chip is in the opening,
wherein the first molding layer fills a space between the connection substrate and the first semiconductor chip in the opening, and
wherein the vertical connection terminal includes a substrate wiring pattern in the connection substrate.

10. A semiconductor package, comprising:
a package substrate;
a first semiconductor chip on the package substrate;
a redistribution layer on the first semiconductor chip;
a plurality of first connection wires on one side of the first semiconductor chip, the first connection wires vertically connecting the package substrate to the redistribution layer; and
a chip stack including a plurality of second semiconductor chips that are stacked on the redistribution layer,
wherein the chip stack is on a side of the redistribution layer opposite to a side of the redistribution layer including the first semiconductor chip,
wherein each second semiconductor chip of the plurality of second semiconductor chips has a chip pad on a bottom surface of the second semiconductor chip, and
wherein the plurality of second semiconductor chips are electrically connected to the redistribution layer through a plurality of second connection wires that vertically connect chip pads of the plurality of second semiconductor chips to substrate pads of the redistribution layer.

11. The semiconductor package of claim 10, wherein
the chip stack is spaced apart from a top surface of the redistribution layer, and
the second semiconductor chip at a lowermost of the chip stack is electrically connected to the redistribution layer through one of the second connection wires.

12. The semiconductor package of claim 10, wherein
the chip stack is in direct contact with a top surface of the redistribution layer,
the chip pad of the second semiconductor chip at a lowermost of the chip stack is directly connected to one of the substrate pads of the redistribution layer, and
the second semiconductor chips other than the second semiconductor chip at the lowermost of the chip stack are electrically connected through the second connection wires to the redistribution layer.

13. The semiconductor package of claim 10, wherein an angle between a second connection wire of the plurality of second connection wires and the chip pad or between the second connection wire of the plurality of second connection wires and a substrate pad of the redistribution layer is in a range of about 30° to about 90°.

14. The semiconductor package of claim 10, wherein
the second semiconductor chips are stacked in a stepwise shape along one direction parallel to a top surface of the redistribution layer, and
each of the second semiconductor chips exposes the chip pad of an overlying second semiconductor chip.

15. The semiconductor package of claim 10, wherein widths of the plurality of second semiconductor chips increase with increasing distance from the redistribution layer, and
each of the second semiconductor chips exposes the chip pad of an overlying second semiconductor chip.

16. The semiconductor package of claim 10, further comprising a molding layer on the redistribution layer, the molding layer covering the chip stack,
wherein a top surface of the molding layer is coplanar with a top surface of the chip stack.

17. A method of fabricating a semiconductor package, the method comprising:
stacking a plurality of first semiconductor chips on a dummy substrate to form a chip stack;
forming a plurality of first bonding wires that connect a dummy pad of the dummy substrate to first chip pads of the first semiconductor chips, an uppermost end of each of the first bonding wires is at a level higher than a level of a top surface of the chip stack;
forming on the dummy substrate a first molding layer that encapsulates the chip stack and the first bonding wires;
allowing the first molding layer to undergo a thinning process that divides the first bonding wires into a plurality of second bonding wires each of which extends from one of the first chip pads and is exposed on a top surface of the first molding layer;
forming on the first molding layer a redistribution layer electrically connected to the second bonding wires;
placing a second semiconductor chip on the redistribution layer, wherein the chip stack is on a side of the redistribution layer opposite to a side of the redistribution layer including the second semiconductor chip;
forming a plurality of vertical connection terminals on one side of the second semiconductor chip and on the redistribution layer; and
forming a package substrate on the redistribution layer and the second semiconductor chip, the package substrate being connected to the vertical connection terminals.

18. The method of claim 17, wherein forming the redistribution layer includes:
forming a dielectric pattern on the first molding layer;
forming a plurality of holes in the dielectric pattern, each of the holes exposing one of the second bonding wires; and
forming on the dielectric pattern a conductive pattern connected through the holes to the second bonding wires.

19. The method of claim 17, wherein forming the vertical connection terminals includes:
forming a plurality of third bonding wires that connect to each other a plurality of substrate pads of the redistribution layer, an uppermost end of each of the third bonding wires is at a level higher than a level of a top surface of the second semiconductor chip;
forming on the dummy substrate a second molding layer that encapsulates the second semiconductor chip and the third bonding wires; and
allowing the second molding layer to undergo a thinning process that divides the third bonding wires into the plurality of vertical connection terminals each of which extends from one of the substrate pads and is exposed on a top surface of the second molding layer.

20. The method of claim 17, further comprising:
removing the dummy substrate; and
performing a sawing process to remove portions of the first bonding wires connected to the dummy pad.

* * * * *